(12) United States Patent
Kamada

(10) Patent No.: US 8,633,517 B2
(45) Date of Patent: Jan. 21, 2014

(54) COMPOUND SEMICONDUCTOR DEVICE AND METHOD OF MANUFACTURING THE SAME

(75) Inventor: Youichi Kamada, Yamato (JP)

(73) Assignee: Fujitsu Limited, Kawasaki (JP)

( * ) Notice: Subject to any disclaimer, the term of this patent is extended or adjusted under 35 U.S.C. 154(b) by 42 days.

(21) Appl. No.: 13/550,810

(22) Filed: Jul. 17, 2012

(65) Prior Publication Data

US 2013/0075749 A1    Mar. 28, 2013

(30) Foreign Application Priority Data

Sep. 28, 2011    (JP) .................................. 2011-212655

(51) Int. Cl.
*H01L 29/66*    (2006.01)

(52) U.S. Cl.
USPC ........................................... 257/194; 257/76

(58) Field of Classification Search
USPC ................................... 257/76, 194
See application file for complete search history.

(56) References Cited

U.S. PATENT DOCUMENTS 5,677,553 A * 10/1997 Yamamoto et al. ........... 257/192
8,338,862 B2 * 12/2012 Yamada et al. ............... 257/194

FOREIGN PATENT DOCUMENTS

| JP | 7-131005 | 5/1995 |
| JP | 10-12872 | 1/1998 |
| JP | 10-104985 | 4/1998 |
| JP | 2003-209246 A1 | 7/2003 |
| JP | 2010-192771 A1 | 9/2010 |

* cited by examiner

*Primary Examiner* — David Vu
*Assistant Examiner* — Brandon Fox
(74) *Attorney, Agent, or Firm* — Kratz, Quintos & Hanson, LLP

(57) ABSTRACT

An embodiment of a compound semiconductor device includes: a substrate; an electron channel layer and an electron supply layer formed over the substrate; a gate electrode, a source electrode and a drain electrode formed on or above the electron supply layer; a first p-type semiconductor layer formed between the electron supply layer and the gate electrode; and a second p-type semiconductor layer formed between the electron supply layer and at least one of the source electrode and the drain electrode. The one of the source electrode and the drain electrode on the second p-type semiconductor layer includes: a first metal film; and a second metal film which contacts the first metal film on the gate electrode side of the first metal film, and a resistance of which is higher than that of the first metal film.

18 Claims, 18 Drawing Sheets

POSITION IN SOURCE ELECTRODE

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2011-212655, filed on Sep. 28, 2011, the entire contents of which are incorporated herein by reference.

FIELD

The embodiments discussed herein are related to a compound semiconductor device and a method of manufacturing the same.

BACKGROUND

In recent years, there has been vigorous development of high-breakdown voltage, high-output compound semiconductor devices, making use of advantages of nitride-based compound semiconductor including high saturation electron mobility and wide band gap. The development is directed to field effect transistors such as high electron mobility transistors (HEMTs), for example. Among them, a GaN-based HEMT having an AlGaN layer as an electron supply layer attracts a lot of attention. In the GaN-based HEMT, lattice distortion occurs in the AlGaN layer due to difference in lattice constants between AlGaN and GaN, the distortion induces piezo polarization therealong, and thereby generates a high-density, two-dimensional electron gas, in the upper portion of the GaN layer laid under the AlGaN layer. This configuration ensures high output.

However, a GaN-based HEMT cannot sometimes stand for long-period use due to miniaturization. Moreover, there is a technique of vanishing the two-dimensional electron gas by forming a p-type GaN layer between the gate electrode and the electron supply layer in order to achieve normally-off operation, but current collapse is likely to happen and the characteristic is likely to be deteriorated if the p-type GaN layer is provided.

[Patent Literature 1] Japanese Laid-Open Patent Publication No. 10-12872
[Patent Literature 2] Japanese Laid-Open Patent Publication No. 2003-209246
[Patent Literature 3] Japanese Laid-Open Patent Publication No. 07-131005
[Patent Literature 4] Japanese Laid-Open Patent Publication No. 10-104985
[Patent Literature 5] Japanese Laid-Open Patent Publication No. 2010-192771

SUMMARY

According to an aspect of the embodiments, a compound semiconductor device includes: a substrate; an electron channel layer and an electron supply layer formed over the substrate; a gate electrode, a source electrode and a drain electrode formed on or above the electron supply layer; a first p-type semiconductor layer formed between the electron supply layer and the gate electrode; and a second p-type semiconductor layer formed between the electron supply layer and at least one of the source electrode and the drain electrode. The one of the source electrode and the drain electrode on the second p-type semiconductor layer includes: a first metal film; and a second metal film which contacts the first metal film on the gate electrode side of the first metal film, and a resistance of which is higher than that of the first metal film.

According to another aspect of the embodiments, a method of manufacturing a compound semiconductor device includes: forming an electron channel layer and an electron supply layer over the substrate; forming a first p-type semiconductor layer and a second p-type semiconductor layer on or above the electron supply layer; forming a gate electrode, a source electrode and a drain electrode on or above the electron supply layer. The gate electrode is formed above the first p-type semiconductor layer. At least one of the source electrode and the drain electrode is formed on the second p-type semiconductor layer. The forming the gate electrode, the source electrode and the drain electrode includes: forming a first metal film; and forming a second metal film which contacts the first metal film on the gate electrode side of the first metal film, and a resistance of which is higher than that of the first metal film, the first metal film and the second film being in the one of the source electrode and the drain electrode on the second p-type semiconductor layer.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Figure 1A:
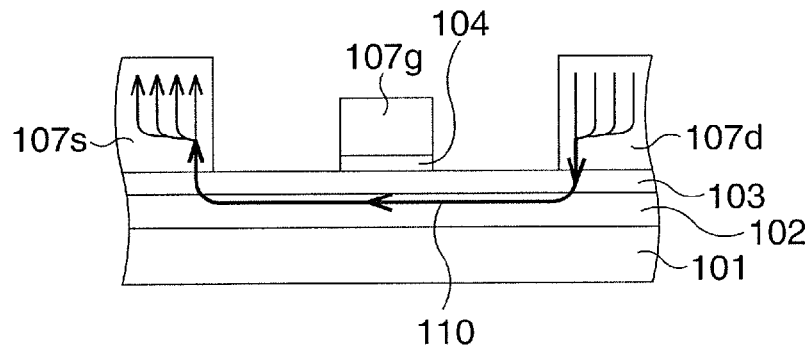
FIG. 1A is a view illustrating a structure of a referential example.

The present inventor investigated the lifetime of the GaN-based HEMT to which the p-type GaN layer is provided between the gate electrode and the electron supply layer in order to achieve the normally-off operation. Specifically, the investigation was performed with a referential example illustrated in FIG. 1A. The referential example included a GaN layer (electron channel layer) 102 and an AlGaN layer 103 (electron supply layer) formed over a substrate 101, and a source electrode 107s and a drain electrode 107d formed on the AlGaN layer 103, as illustrated in FIG. 1A. A p-type GaN layer 104 and a gate electrode 107g were formed on the AlGaN layer 103 between the source electrode 107s and the drain electrode 107d in planar view.

Figure 1B:
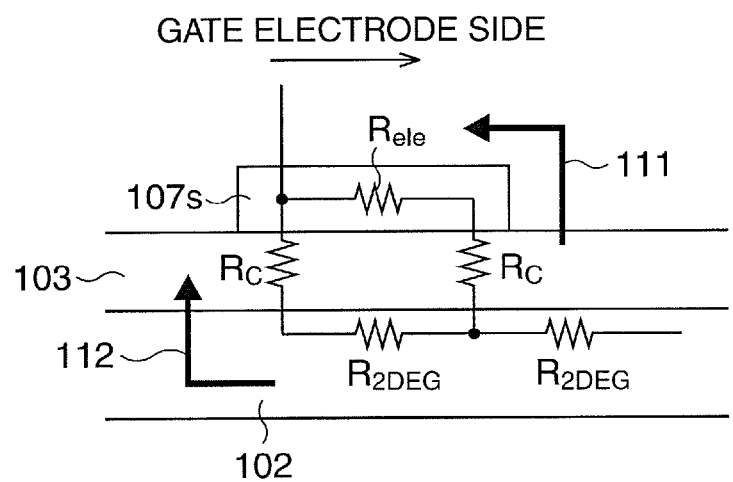
FIG. 1B is a view illustrating a current path in the referential example.

As a result of the investigation about the current path in the referential example, it was found out that the current density was increased locally in the source electrode 107s and the drain electrode 107d, each of which was a Schottky electrode, due to the miniaturization. In other words, most of current flew in a region close to the gate electrode 107g in both of the source electrode 107s and the drain electrode 107d, and the current path 110 concentrated into the region. The reason is explained below. The resistance in the vicinity of the source electrode is illustrated in FIG. 1B.

Figure 1C:
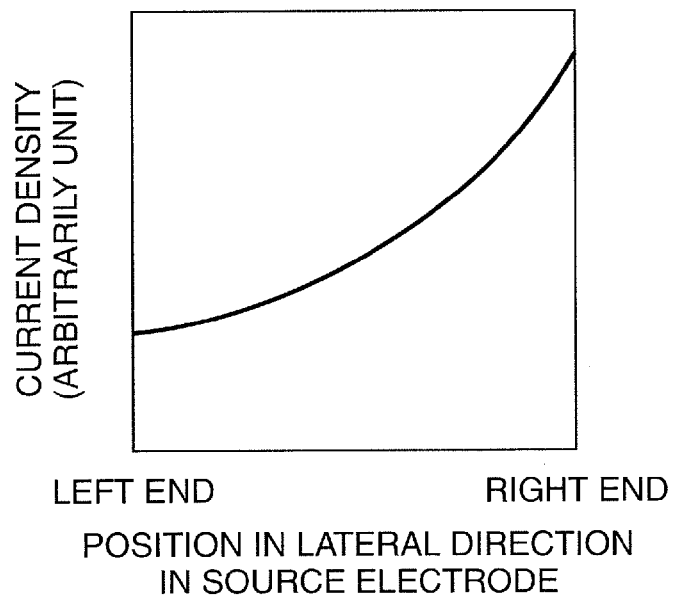
FIG. 1C is a diagram illustrating a characteristic of the referential example.

There are a resistance value $R_{ele}$ of a current path in which a current flows laterally in the source electrode 107s, a resistance value $R_C$ of a current path in which a current flows vertically in the AlGaN layer 103, and a resistance value $R_{2DEG}$ of a current path in which a current flows laterally in the two-dimensional electron gas (2DEG) layer in the GaN layer 102. There may be two really extreme cases relating to the current path. One of them is a path 111 in which a current flows vertically in the AlGaN layer 103 and flows laterally in the source electrode 107s, from the GaN layer 102. The other one of them is a path 112 in which a current flows laterally in the 2DEG in the GaN layer 102 below the source electrode 107s and flows vertically in the AlGaN layer 103, from the GaN layer 102. As for the two paths 111 and 112, since the resistance value $R_{ele}$ is much lower than the resistance value $R_{2DEG}$, most of the current flows in the path 111. Thus, a region where the current density is extremely high appears. In other words, the current density at the right end of the source electrode 107s in FIG. 1A is extremely higher than that at the left end, as illustrated in FIG. 1C. When the region in which the current density is extremely high exists, electro-migration occurs in the vicinity of the region due to the high current density itself and temperature increasing associated with the high current density. Then the source electrode 107s and so forth may be damaged with change or the like, and the resistance value increases. When the source electrode 107s is in contact with a Au film of a source wiring, a purple plague, which is a high resistance substance, is generated and the source electrode 107s is deteriorated. These phenomena arise also in the drain electrode 107d.

Moreover, it was found that the current collapse occurs and the characteristics are lowered, since dry etching was performed to form the p-type GaN layer 104, the AlGaN layer 103 was damaged by the etching, and the surface of the AlGaN layer 103 got rough.

Embodiments will be detailed below, referring to the attached drawings.

First Embodiment

Figure 2A:
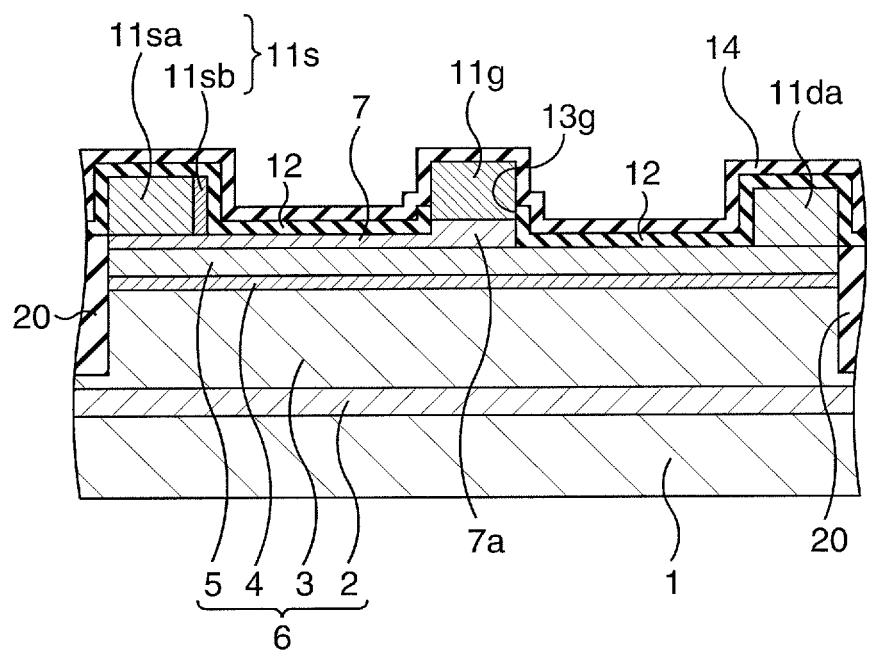
FIG. 2A is a cross sectional view illustrating a structure of a compound semiconductor device according to a first embodiment.
Figure 2B:
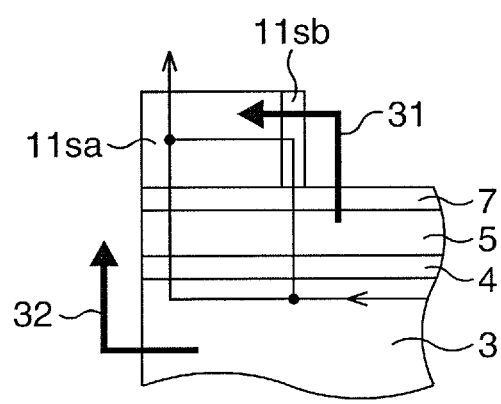
FIG. 2B is a view illustrating a current path in the compound semiconductor device according to the first embodiment.

A first embodiment will be described. FIGS. 2A and 2B are views illustrating a GaN-based HEMT (compound semiconductor device) according to the first embodiment.

In the first embodiment, as illustrated in FIG. 2A, a compound semiconductor stacked structure 6 is formed over a substrate such as Si substrate. The compound semiconductor stacked structure 6 includes a buffer layer 2, an electron channel layer 3, a spacer layer 4, and an electron supply layer 5. The buffer layer 2 may be an AlN layer of approximately 100 nm thick, for example. The electron channel layer 3 may be an i-GaN layer of approximately 3 μm thick, which is not intentionally doped with an impurity, for example. The spacer layer 4 may be an i-AlGaN layer of approximately 5 nm thick, which is not intentionally doped with an impurity, for example. The electron supply layer 5 may be an n-type AlGaN (n-AlGaN) layer of approximately 30 nm thick, for example. The electron supply layer 5 may be doped with approximately $5\times10^{18}/cm^3$ of Si as an n-type impurity, for example.

A p-type semiconductor layer 7 is formed over the compound semiconductor stacked structure 6. The p-type semiconductor layer 7 may be a p-type GaN (p-GaN) layer. The p-type semiconductor layer 7 may be doped with approximately $5\times10^{19}/cm^3$ of Mg as a p-type impurity, for example. An element isolation region 20 which defines an element region is formed in the compound semiconductor stacked structure 6 and the p-type semiconductor layer 7. The p-type semiconductor layer 7 is formed such that a part of the compound semiconductor stacked structure 6 is exposed from the p-type semiconductor layer 7 in the element region. A source electrode 11s is formed on the p-type semiconductor layer 7, and a metal film 11da which functions as a drain electrode is formed on a portion of the compound semiconductor stacked structure 6, the part being exposed from the p-type semiconductor layer 7. A convex portion 7a is provided at a position of the p-type semiconductor layer 7 between the source electrode 11s and the metal film 11da in planar view. A thickness of the p-type semiconductor layer 7 at a position of the convex portion 7a is 300 Å (30 nm) or more, for example. A portion of the p-type semiconductor layer 7 on the source electrode 11s side of the convex portion 7a is thinner than the convex portion 7a, a thickness of the portion is 50 Å (5 nm) or less, for example. The p-type semiconductor layer does not exist on the metal film 11da side of the convex portion 7a. The convex portion 7a is an example of the first p-type semiconductor layer, and the portion of the p-type semiconductor layer 7 below the source electrode 11s is an example of the second p-type semiconductor layer.

The source electrode 11s includes a metal film 11sa and a metal film 11sb located on the metal film 11da side of the metal film 11sa. A resistance of the metal film 11sb is higher than a resistance of the metal film 11sa. The metal films 11sa and 11sb are in contact with each other. A contact area between the metal film 11sa and the p-type semiconductor layer 7 may be approximately 100 times more than a contact area between the metal film 11sb and the p-type semiconductor layer 7, for example, though it depends on the materials thereof. A stack of a Ti film and an Al film thereon may be used for the metal film 11sa and the metal film 11da, and a stack of a Ni film and a Au film thereon may be used for the metal film 11sb, for example. The metal film 11sa is an example of the first metal film, and the metal film 11sb is an example of the second metal film.

An insulating film 12 is formed so as to cover the source electrode 11s and the metal film 11da over the p-type semiconductor layer 7 and the electron supply layer 5. An opening 13g is formed in the insulating film 12 so as to expose the convex portion 7a of the p-type semiconductor layer 7, and a gate electrode 11g is formed in the opening 13g. A stack of a Ti film and an Al film thereon may be used for the gate electrode 11g, for example. An insulating film 14 is formed so as to cover the gate electrode 11g over the insulating film 12. While materials for the insulating films 12 and 14 are not specifically limited, a Si nitride film may be used, for example. The insulating films 12 and 14 are an example of the termination film.

In the GaN-based HEMT thus configured, the convex portion 7a of 300 Å or more thick is provided between the gate electrode 11g and the electron supply layer 5. Therefore, the conduction band ($E_C$) is pulled up, and there rarely exists a region in which the conduction band ($E_C$) is lower than the Fermi level ($E_F$). Accordingly, when the voltage applied to the gate electrode 11g is 0 V, in other words when the transistor is in off-state, the 2DEG rarely exists under the gate electrode 11g and the normally-off operation can be achieved.

There may be two really extreme cases relating to the current path, as illustrated in FIG. 2B. One of them is a path 31 in which a current flows vertically in the spacer layer 4, the electron supply layer 5 and the p-type semiconductor layer 7, and flows laterally in the source electrode 11s, from the electron channel layer 3. The other one of them is a path 32 in which a current flows laterally in the 2DEG in the electron channel layer 3 below the source electrode 11s and flows vertically in the spacer layer 4, the electron supply layer 5 and the p-type semiconductor layer 7, from the electron channel layer 3. Although the resistance of the 2DEG in the electron channel layer 3 in the path 32 is higher than the resistance of the metal film 11sa, the total resistance of the path 32 is similar to that of the path 31, since the metal film 11sb, which have a relatively high resistance, exists in the path 31. As a result, the concentration of current in the source electrode 11s can be largely let down compared to the referential example. In other words, the current may flow not only in a region on the gate electrode 11g side of the source electrode 11s but also in a region far from the gate electrode 11g. Therefore, the concentration of current density can be relaxed, and the electro-migration and so forth due to the high current density itself and the temperature increasing associated with the high current density can be suppressed.

Note that the stack of the Ti film and the Al film thereon has an ohmic contact with the p-type semiconductor layer 7, when the p-type semiconductor layer 7 is thin, for example 20 nm or less thick. On the other hand, the stack has a Schottky contact with the p-type semiconductor layer 7, when the p-type semiconductor layer 7 is thick, for example 3 nm or more thick. Therefore, the stack of the Ti film and the Al film thereon for the metal film 11sa functions as an ohmic electrode, and the stack of the Ti film and the Al film thereon for the gate electrode 11g functions as a Schottky electrode. The stack of the Ni film and the Au film thereon has an ohmic contact with the p-type semiconductor layer 7. Accordingly, the stack of the Ni film and the Au film thereon for the metal film 11sb functions as an ohmic electrode. The stack of the Ti film and the Al film thereon has an ohmic contact with the n-type semiconductor layer. Accordingly, the stack of the Ti film and the Al film thereon for the metal film 11da functions as an ohmic electrode.

When the thickness of the p-type semiconductor layer 7 is over 5 nm, the density of the 2DEG in the vicinity of the surface of the electron channel layer is low below the p-type semiconductor layer 7, and the on-resistance is likely to be high. Therefore, it is preferable that the thickness of the p-type semiconductor layer 7 is 5 nm or less except for the convex portion 7a.

Figure 3A:
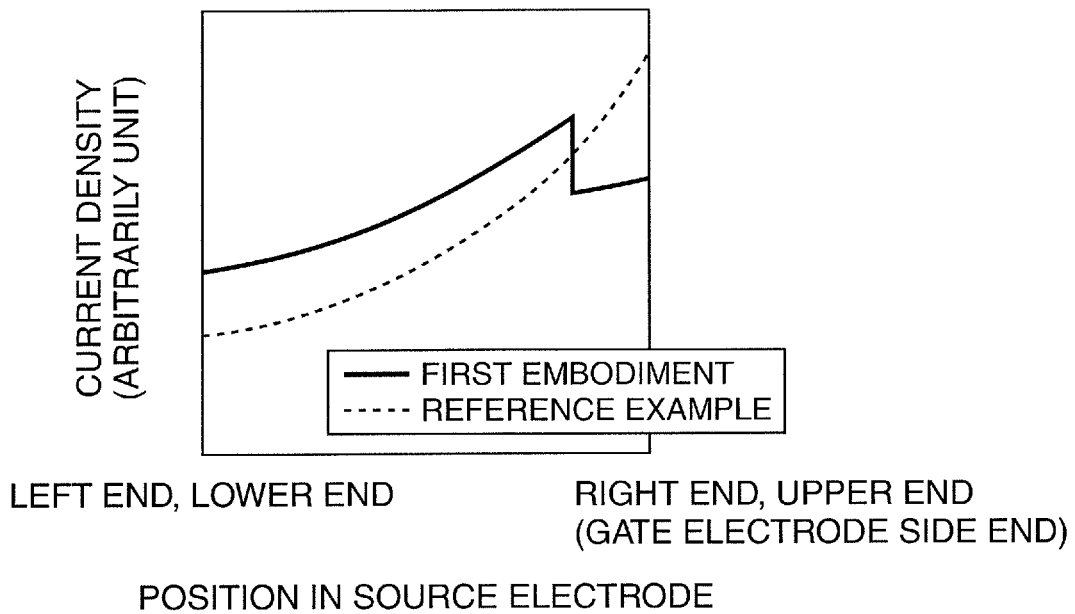
FIGS. 3A and 3B are drawings illustrating characteristics of the compound semiconductor device according to the first embodiment.
Figure 3B:
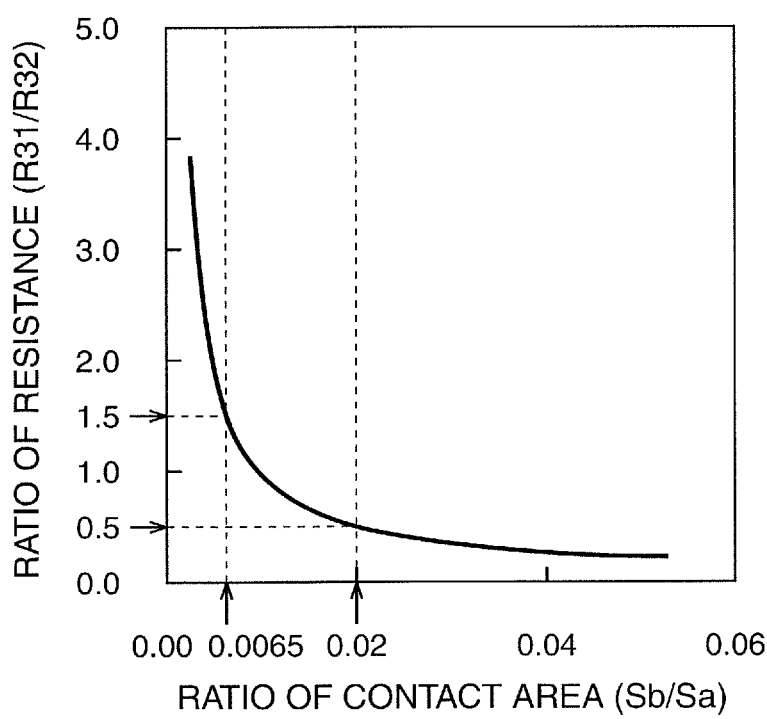

The ratio of the contact areas of the metal film 11sa and the metal film 11sb to the p-type semiconductor layer 7 is not specifically limited. The value "R31/R32", which is a ratio of the resistance value R31 of the path 31 including the metal film 11sb to the resistance value R32 of the path 32 not including the metal film 11sb, varies on the value "Sb/Sa", which is a ratio of the contact area of the metal film 11sb with the p-type semiconductor layer 7 to the contact area of the metal film 11sa with the p-type semiconductor layer 7, as illustrated in FIG. 3B. Then the concentration of the current density is suppressed extremely well, when the value "R31/R32" is 0.5 or more and 1.5 or less. Therefore, the value "Sb/Sa" is preferably 0.0065 or more and 0.02 or less, more preferably 0.015 or less, as illustrated in FIG. 3B.

Next, a method of manufacturing the GaN-based HEMT (compound semiconductor device) according to the first embodiment will be explained. FIG. 4A to FIG. 4L are cross sectional views illustrating, in sequence, the method of manufacturing the GaN-based HEMP (compound semiconductor device) according to the first embodiment.

Figure 4A:
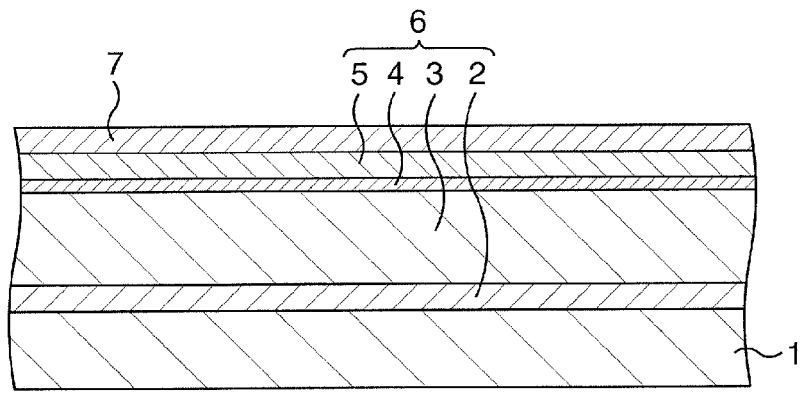
FIGS. 4A to 4L are cross sectional views illustrating, in sequence, a method of manufacturing the compound semiconductor device according to the first embodiment.

First, as illustrated in FIG. 4A, the compound semiconductor stacked structure 6 is formed over the substrate 1, and the p-type semiconductor layer 7 is formed over the compound semiconductor stacked structure 6. In the process of forming the compound semiconductor stacked structure 6 and the p-type semiconductor layer 7, the buffer layer 2, the electron channel layer 3, the spacer layer 4, the electron supply layer 5 and the p-type semiconductor layer 7 may be formed by metal organic vapor phase epitaxy (MOVPE), for example. In the process of forming the compound semiconductor layers, a mixed gas of trimethylaluminum (TMA) gas as an Al source, trimethylgallium (TMG) gas as a Ga source, and ammonia ($NH_3$) gas as a N source, may be used. In the process, on/off of supply and flow rates of trimethylaluminum gas and trimethylgallium gas are appropriately set, depending on compositions of the compound semiconductor layers to be grown. Flow rate of ammonia gas, which is common to all compound semiconductor layers, may be set to approximately 100 ccm to 10 LM. Growth pressure may be adjusted to approximately 50 Torr to 300 Torr, and growth temperature may be adjusted to approximately 1000° C. to 1200° C., for example. In the process of growing the n-type compound semiconductor layers, Si may be doped into the compound semiconductor layers by adding $SiH_4$ gas, which contains Si, to the mixed gas at a predetermined flow rate, for example. Dose of Si is adjusted to approximately $1\times10^{18}/cm^3$ to $1\times10^{20}/cm^3$, and to $5\times10^{18}/cm^3$ or around, for example. Dose of Mg to the p-type semiconductor layer 7 is adjusted to approximately $5\times10^{19}/cm^3$ to $1\times10^{20}/cm^3$, and to $5\times10^{19}/cm^3$ or around, for example. Then annealing is performed so as to activate Mg. A thickness of the p-type semiconductor layer 7 is adjusted to 30 nm or more, for example.

Figure 4B:
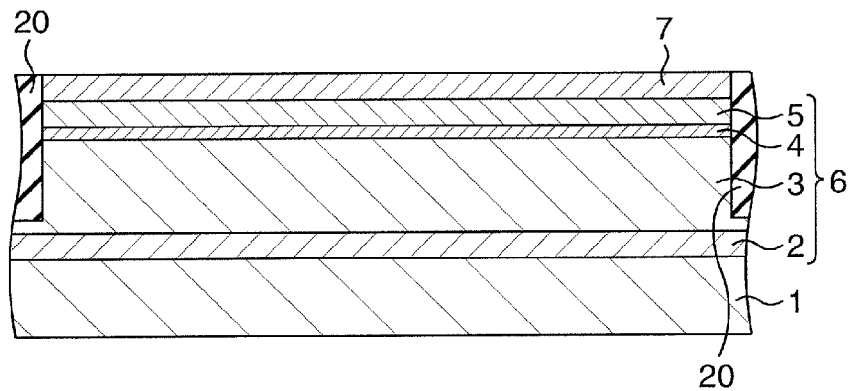

Next, as illustrated FIG. 4B, the element isolation region 20 which defines the element region is formed in the compound semiconductor stacked structure 6 and the p-type semiconductor layer 7. In the process of forming the element isolation region 20, for example, a photoresist pattern is formed over the p-type semiconductor layer 7 so as to selectively expose region where the element isolation region 20 is to be formed, and ion such as Ar ion is implanted through the photoresist pattern used as a mask. Alternatively, the p-type semiconductor layer 7 and the compound semiconductor stacked structure 6 may be etched by dry etching using a chlorine-containing gas, through the photoresist pattern used as an etching mask.

Figure 4C:
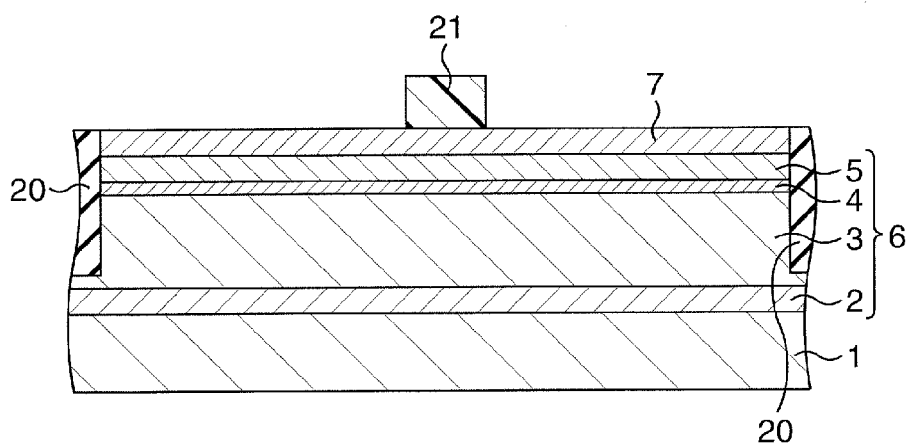

Thereafter, as illustrated in FIG. 4C, a photoresist is coated and then patterned, to thereby form a resist pattern 21 so as to cover a region in which the gate electrode is to be formed, and so as to expose the residual region.

Figure 4D:
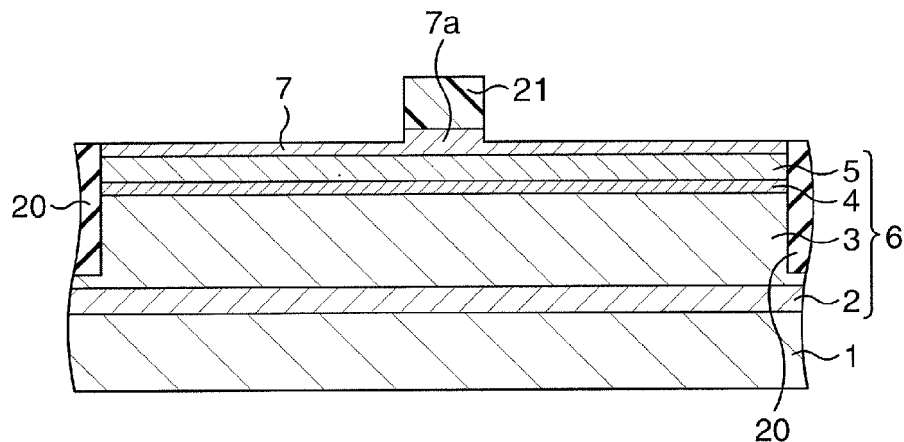

Next, as illustrated in FIG. 4D, the p-type semiconductor layer 7 is etched by dry etching using the resist pattern 21 as an etching mask so as to remove the portion of the p-type semiconductor layer 7, the portion being exposed from the resist pattern 21, and thin the portion up to a thickness of approximately 20 nm or less, for example, about 1 nm. As a result, the convex portion 7a is formed at the region which has been covered by the resist pattern 21.

Figure 4E:
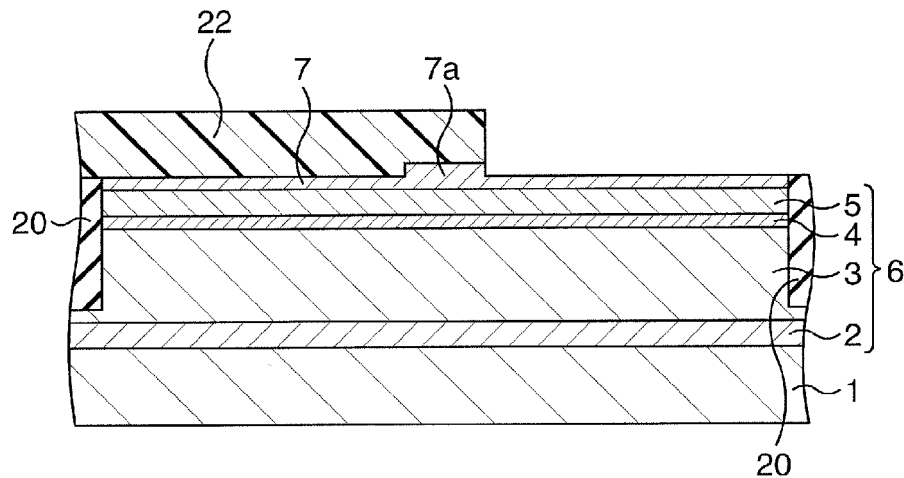

The resist pattern 21 is then removed, and a resist pattern 22 is formed over the p-type semiconductor layer 7 and the element isolation region 20 so as to cover the convex portion 7a and a region side of the convex portion 7a, in the region the source electrode being to be formed, and so as to expose the residual region, as illustrated in FIG. 4E.

Figure 4F:
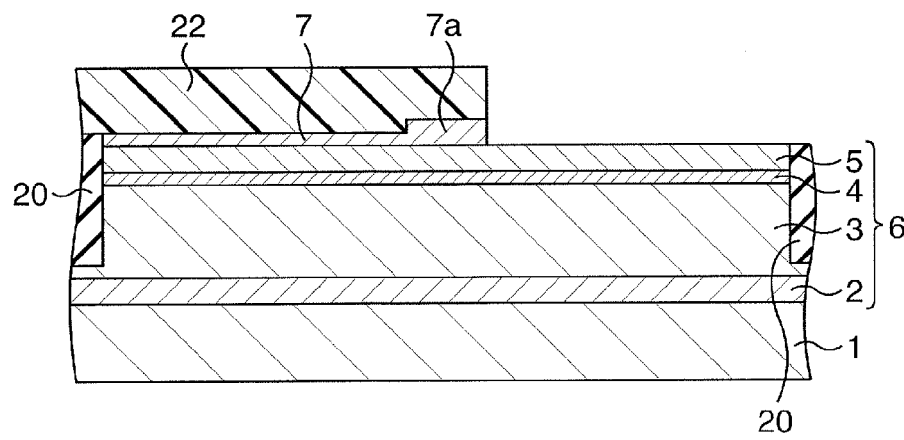

Next, as illustrated in FIG. 4F, the p-type semiconductor layer 7 is etched by dry etching using the resist pattern 22 as an etching mask so as to remove the portion of the p-type semiconductor layer 7, the portion being exposed from the resist pattern 22. As a result, the electron supply layer 5 is exposed in a region side of the convex portion 7a, in the region the drain electrode being to be formed.

Figure 4G:
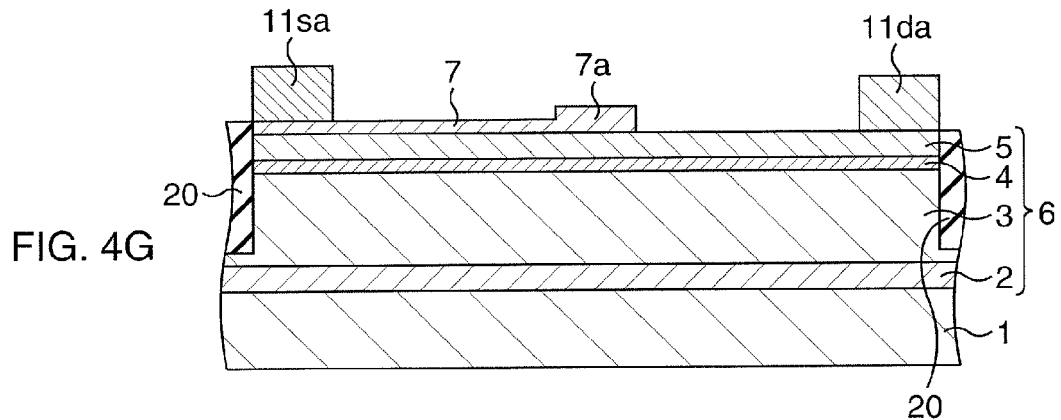

Thereafter, the resist pattern 22 is removed, the metal film 11sa is formed on the thinned portion of the p-type semiconductor layer 7, and the metal film 11da is formed on the electron supply layer 5, as illustrated in FIG. 4G. The metal film 11sa and the metal film 11da may be formed by a lift-off process, for example. More specifically, a photoresist pattern is formed so as to expose regions where the metal film 11sa and the metal film 11da are to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ti film may be formed, and an Al film may be then formed.

Figure 4H:
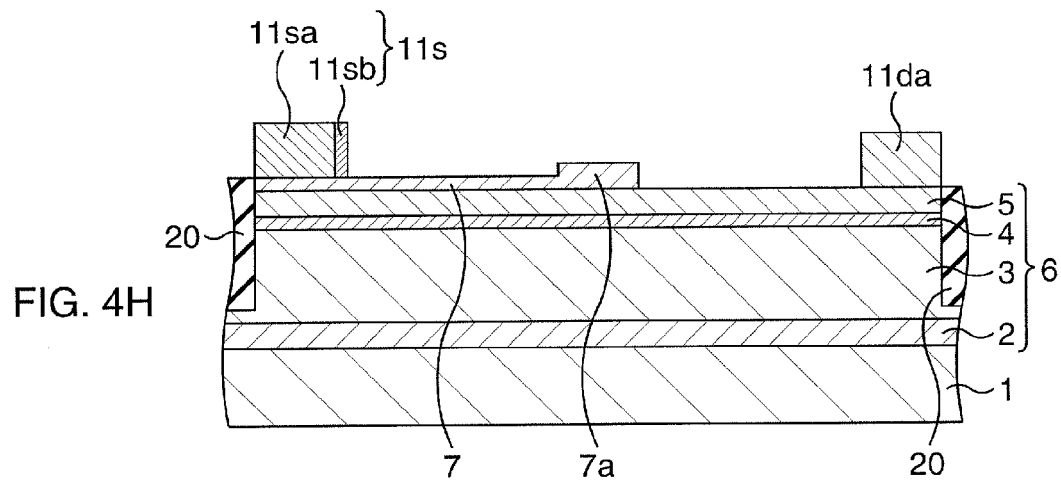

Next, the metal film 11sb is formed so as to be in contact with the metal film 11sa on the convex portion 7a side of the metal film 11sa on the p-type semiconductor layer 7, as illustrated in FIG. 4H. The metal film 11sb may also be formed by a lift-off process, for example. More specifically, a photoresist pattern is formed so as to expose a region where the metal film 11sb is to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ni film may be formed, and a Au film may be then formed. The metal films are then annealed, for example, in a nitrogen atmosphere at 400° C. to 1000° C. (at 600° C., for example) to thereby ensure the ohmic characteristic. The source electrode 11s including the metal films 11sa and 11sb is formed, and the metal film 11da functions as the drain electrode.

Figure 4I:
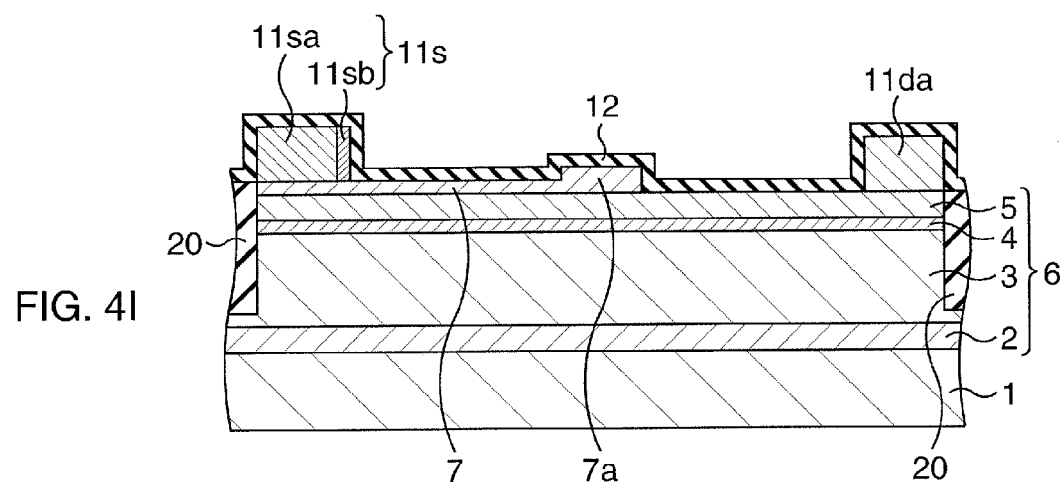

Then as illustrated in FIG. 4I, the insulating film 12 is formed over the entire surface. The insulating film 12 is preferably formed by atomic layer deposition (ALD), plasma-assisted chemical vapor deposition (CVD), or sputtering.

Figure 4J:
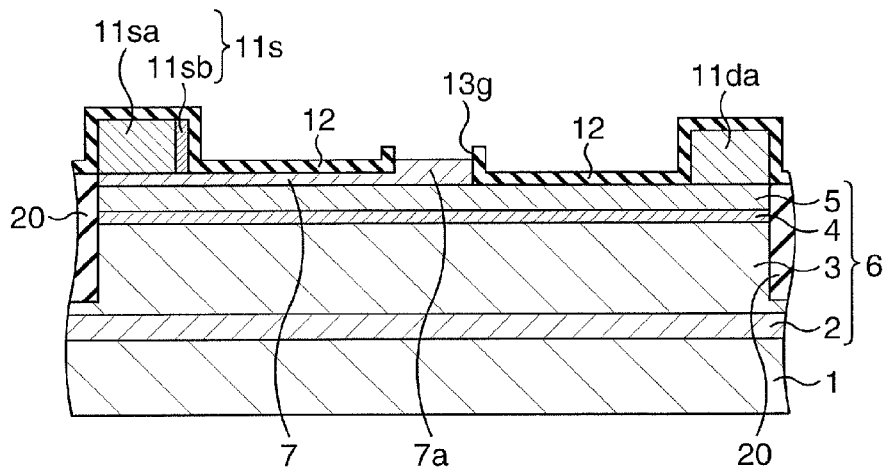

Next, as illustrated in FIG. 4J, the opening 13g is formed in the insulating film 12 so as to expose the convex portion 7a.

Figure 4K:
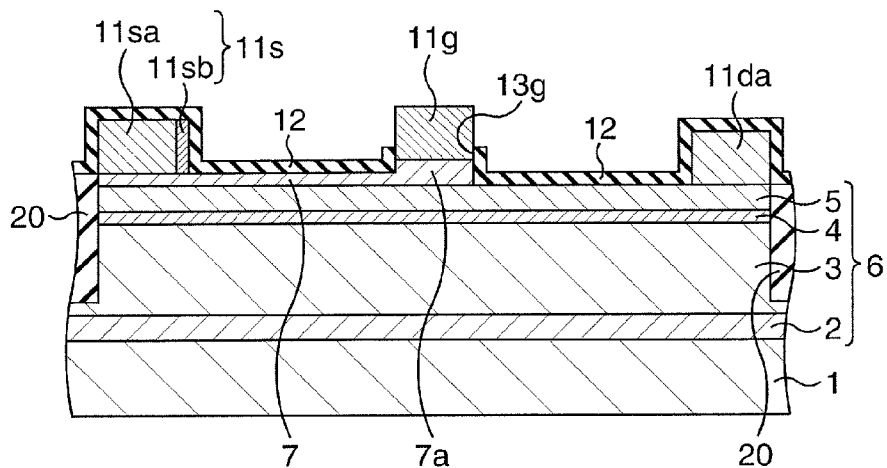

Next, as illustrated in FIG. 4K, the gate electrode 11g is formed in the opening 13g. The gate electrode 11g may be formed by a lift-off process, for example. More specifically, a photoresist pattern is formed so as to expose a region where the gate electrode 11g is to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ti film may be formed, and an Al film may be then formed.

Figure 4L:
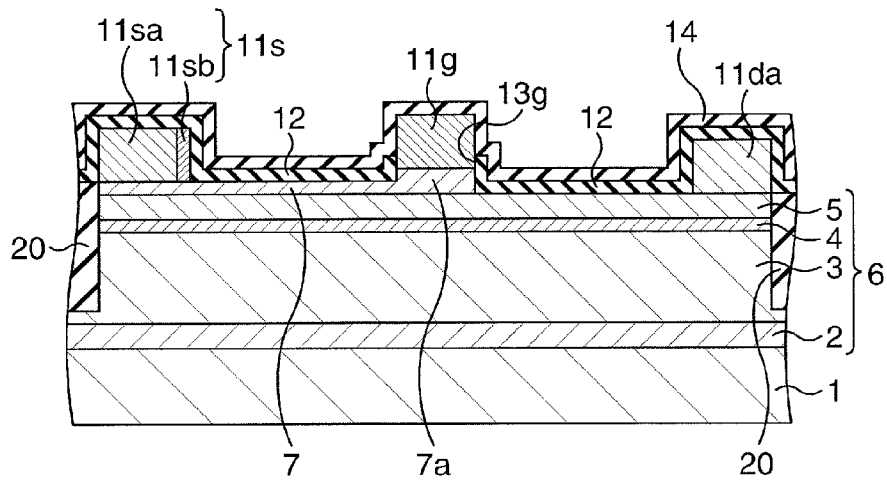

Thereafter, as illustrated in FIG. 4L, the insulating film 14 is formed over the insulating film 12 so as to cover the gate electrode 11g.

The GaN-based HEMT according to the first embodiment may be thus manufactured.

In the method described above, since a portion of the p-type semiconductor layer 7 remains between the gate electrode 11g and the source electrode 11s, the etching damage can be suppressed in a region of the electron supply layer 5 covered with the p-type semiconductor layer 7. Therefore, deterioration of characteristic such as a current collapse can be suppressed.

Second Embodiment

Figure 5:
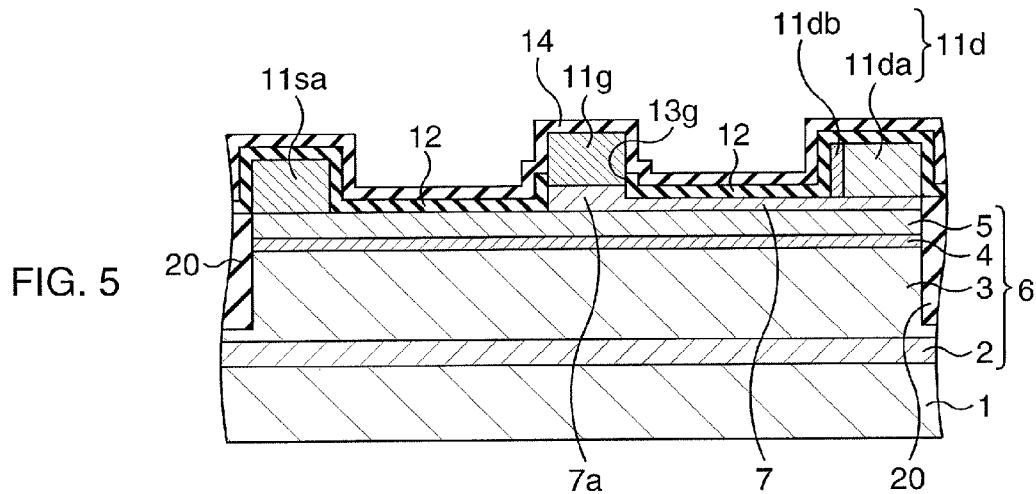
FIG. 5 is a cross sectional view illustrating a structure of a compound semiconductor device according to a second embodiment.

Next, a second embodiment will be explained. FIG. 5 is a cross sectional view illustrating a structure of a GaN-based HEMT (compound semiconductor device) according to the second embodiment.

In contrast to the first embodiment, having the p-type semiconductor layer 7 remaining on the source electrode side of the convex portion 7a, the p-type semiconductor layer 7 remains on the drain electrode side of the convex portion 7a in the second embodiment. In other words, in the second embodiment, a drain electrode 11d is formed on the p-type semiconductor layer 7, and the metal film 11sa as the source electrode is formed on a portion of the compound semiconductor stacked structure 6, the portion being exposed from the p-type semiconductor layer 7. The convex portion 7a is provided at a position of the p-type semiconductor layer 7 between the drain electrode 11d and the metal film 11sa in planar view, and the thickness of the p-type semiconductor layer 7 at a position of the convex portion 7a is 300 Å (30 nm) or more, for example. A portion of the p-type semiconductor layer 7 on the drain electrode lid side of the convex portion 7a is thinner than the convex portion 7a, a thickness of the portion is 50 Å (5 nm) or less, for example. The p-type semiconductor layer 7 does not exist on the metal film 11sa side of the convex portion 7a. The convex portion 7a is an example of the first p-type semiconductor layer, and the portion of the p-type semiconductor layer 7 below the drain electrode 11d is an example of the second p-type semiconductor layer.

The drain electrode 11d includes a metal film 11da and a metal film 11db located on the metal film 11sa side of the metal film 11da. A resistance of the metal film 11db is higher than a resistance of the metal film 11da. The metal films 11da and 11db are in contact with each other. A contact area between the metal film 11da and the p-type semiconductor layer 7 may be approximately 100 times more than a contact area between the metal film 11db and the p-type semiconductor layer 7, for example, though it depends on the materials thereof. A stack of a Ni film and a Au film thereon may be used for the metal film 11db, for example, similarly to the metal film 11sb in the first embodiment. The metal film 11da is an example of the first metal film, and the metal film 11db is an example of the second metal film. Other structure is similar to the first embodiment.

Also the second embodiment thus configured successfully achieves, similarly to the first embodiment, the effect of suppressing and relaxing the concentration of the current density, with the presence of the p-type semiconductor layer 7 and the metal film 11db. Note that the value "Sb/Sa" is preferably 0.0065 or more and 0.02 or less, more preferably 0.015 or less, based on the same reason in the first embodiment.

Next, a method of manufacturing the GaN-based HEMT (compound semiconductor device) according to the second embodiment will be explained. FIG. 6A to FIG. 6E are cross sectional views illustrating, in sequence, the method of manufacturing the GaN-based HEMT (compound semiconductor device) according to the second embodiment.

Figure 6A:
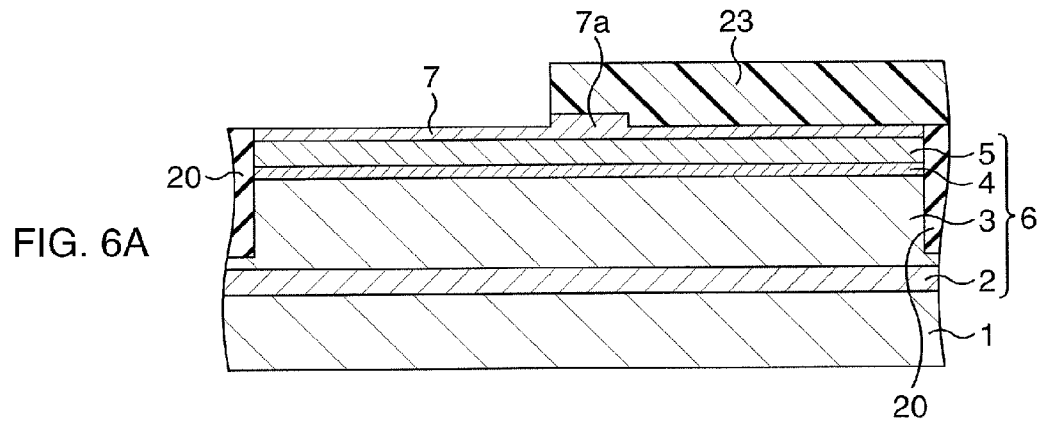
FIGS. 6A to 6E are cross sectional views illustrating, in sequence, a method of manufacturing the compound semiconductor device according to the second embodiment.

First, the processes up to the formation of the convex portion 6a are conducted similarly to the first embodiment (see FIG. 4D). As illustrated in FIG. 6A, the resist pattern 21 is then removed, and a resist pattern 23 is formed over the p-type semiconductor layer 7 and the element isolation region 20 so as to cover the convex portion 7a and a region side of the convex portion 7a, in the region the drain electrode being to be formed, and so as to expose the residual region.

Figure 6B:
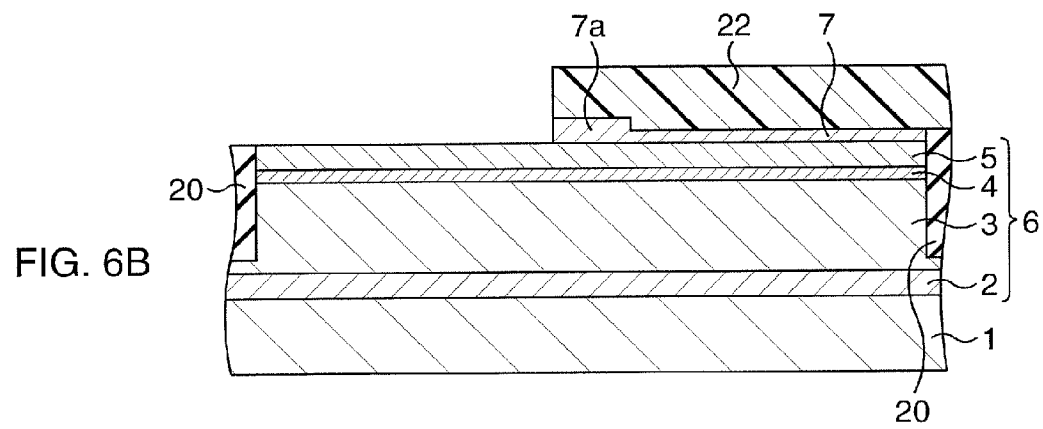

Next, as illustrated in FIG. 6B, the p-type semiconductor layer 7 is etched by dry etching using the resist pattern 23 as an etching mask so as to remove the portion of the p-type semiconductor layer 7, the portion being exposed from the resist pattern 23. As a result, the electron supply layer 5 is exposed in a region side of the convex portion 7a, in the region the source electrode being to be formed.

Figure 6C:
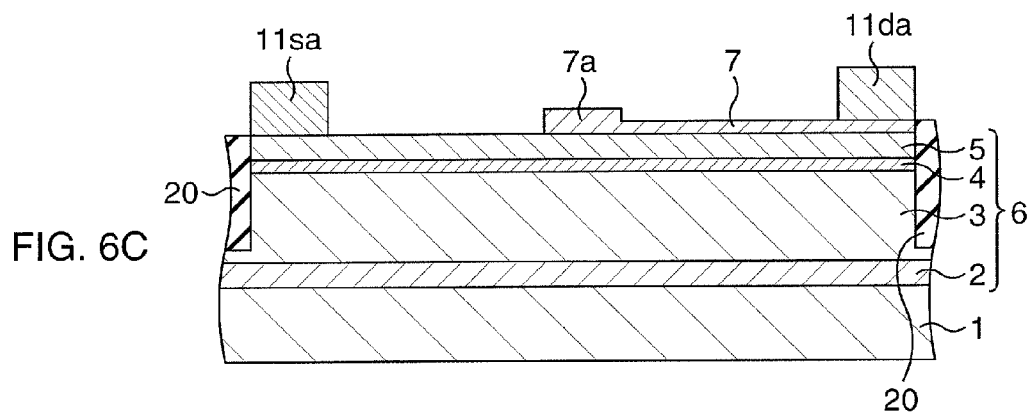

Thereafter, the resist pattern 23 is removed, the metal film 11da is formed on the thinned portion of the p-type semiconductor layer 7, and the metal film 11sa is formed on the electron supply layer 5, as illustrated in FIG. 6C. The metal film 11sa and the metal film 11da may be formed by a method similar to the first embodiment.

Figure 6D:
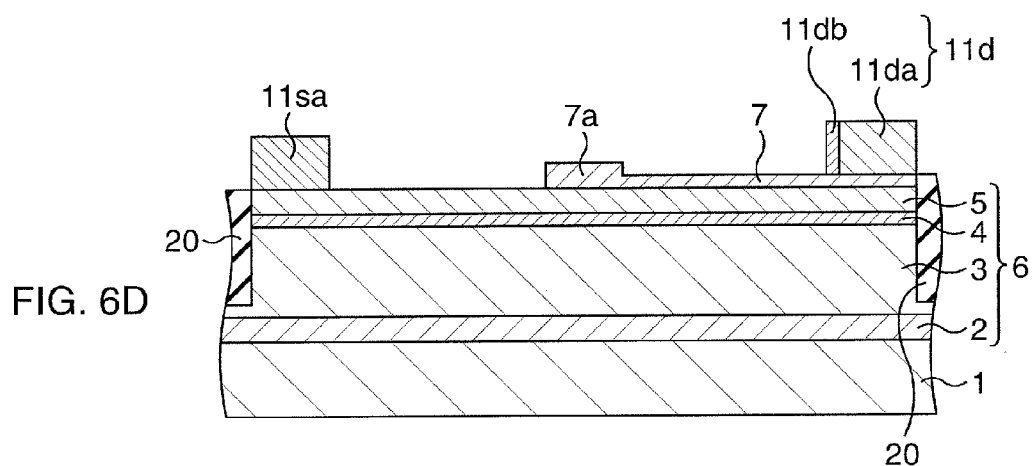

Next, the metal film 11db is formed so as to be in contact with the metal film 11da on the convex portion 7a side of the metal film 11da on the p-type semiconductor layer 7, as illustrated in FIG. 6D. The metal film 11db may also be formed by a method similar to one for forming the metal film 11sb in the first embodiment. The metal films are then annealed, for example, in a nitrogen atmosphere at 400° C. to 1000° C. (at 600° C., for example) to thereby ensure the ohmic characteristic. The drain electrode 11d including the metal films 11da and 11db is formed, and the metal film 11sa functions as the source electrode.

Figure 6E:
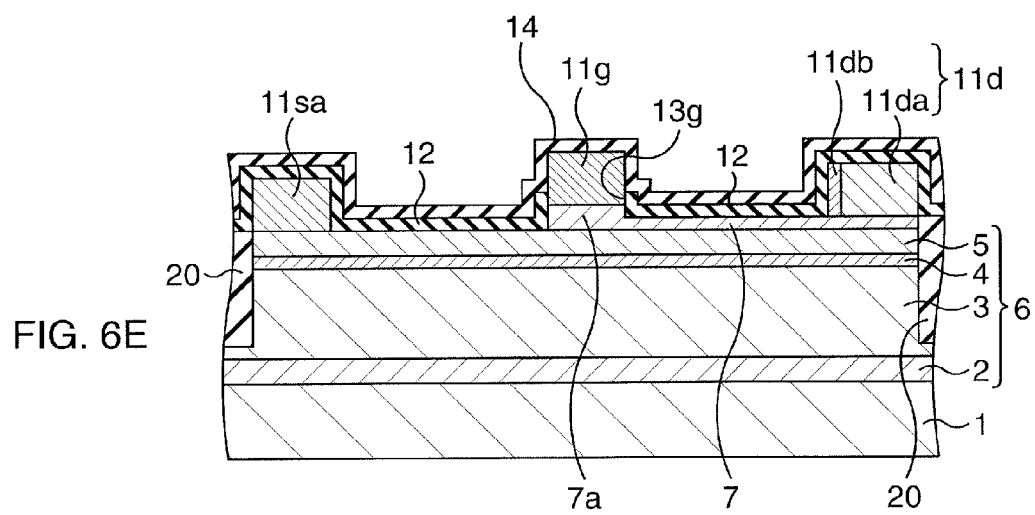

Then, as illustrated in FIG. 6E, the processes covering from the formation of the insulating film 12 up to the formation of the insulating film 14 are conducted similarly to the first embodiment, as illustrated in FIG. 6E.

In the described method, since a portion of the p-type semiconductor layer 7 remains between the gate electrode 11g and the drain electrode 11d, the etching damage can be suppressed in a region of the electron supply layer 5 covered with the p-type semiconductor layer 7. Therefore, deterioration of characteristic such as a current collapse can be suppressed.

Third Embodiment

Figure 7:
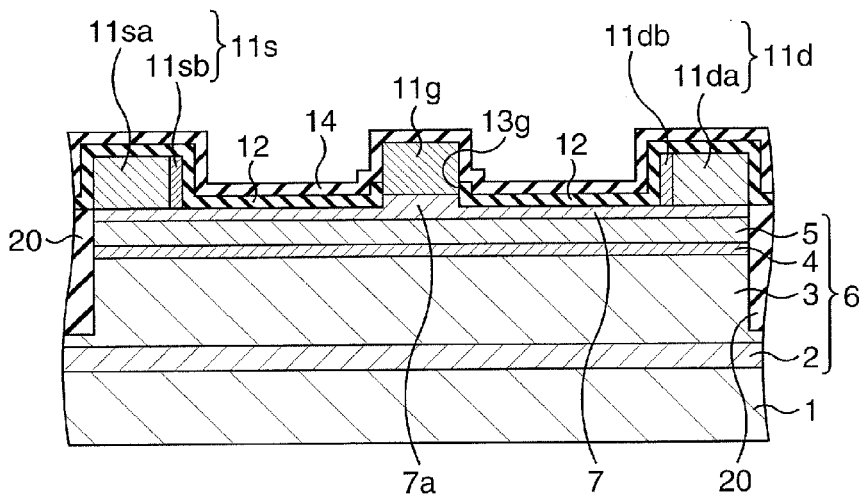
FIG. 7 is a cross sectional view illustrating a structure of a compound semiconductor device according to a third embodiment.
Figure 8A:
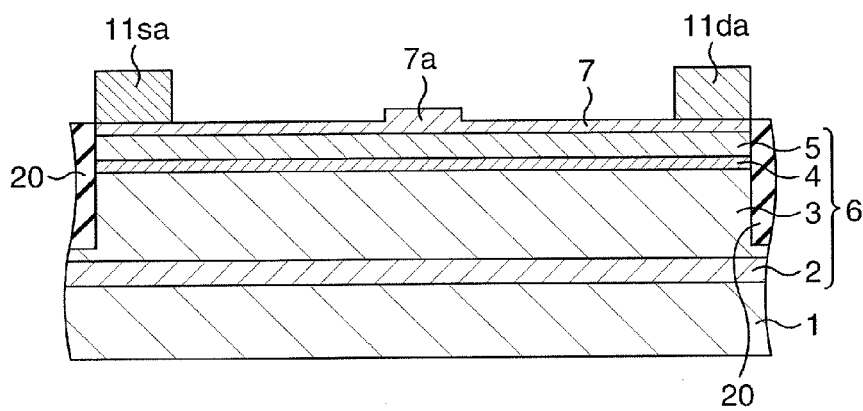
FIGS. 8A to 8D are cross sectional views illustrating, in sequence, a method of manufacturing the compound semiconductor device according to the third embodiment.
Figure 8B:
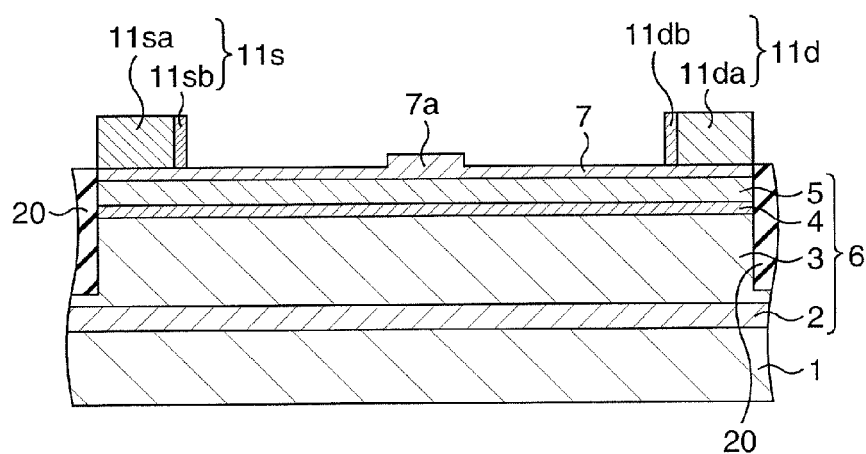
Figure 8C:
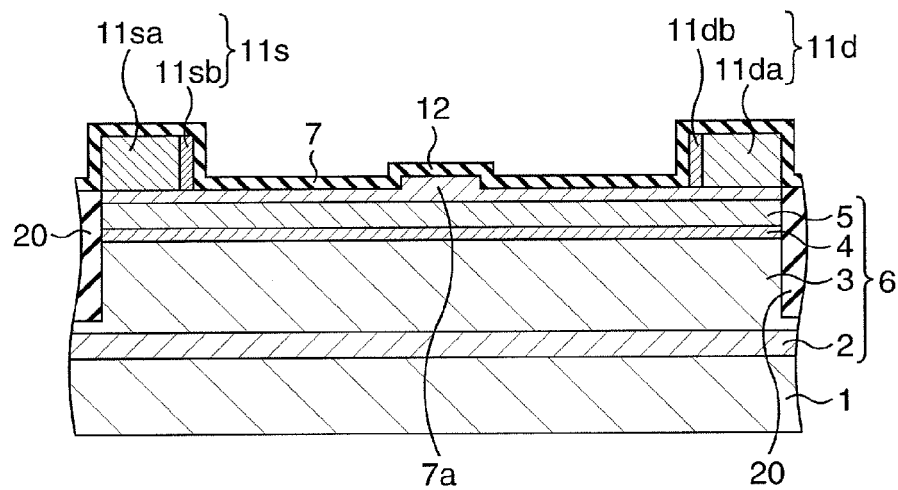
Figure 8D:
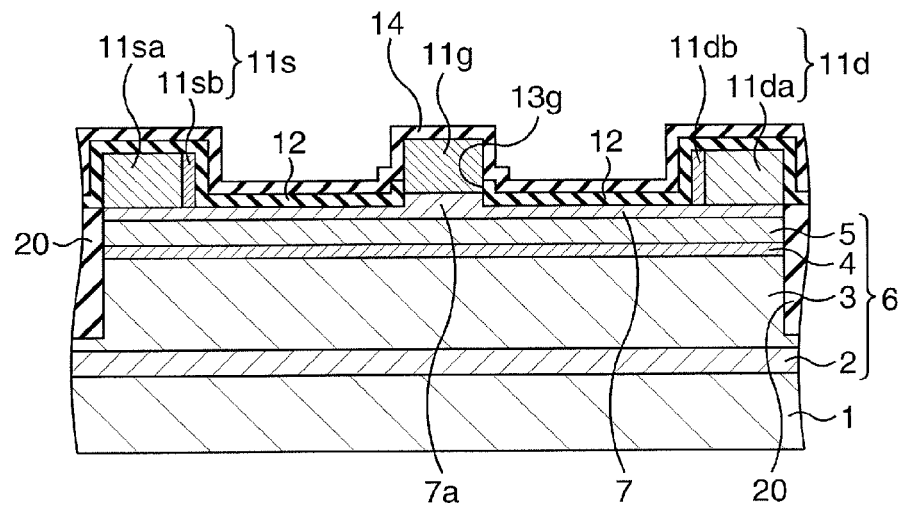

Next, a third embodiment will be explained. FIG. 7 is a cross sectional view illustrating a structure of a GaN-based HEMT (compound semiconductor device) according to the third embodiment.

In contrast to the first embodiment, having the p-type semiconductor layer 7 remaining on the source electrode side of the convex portion 7a, the p-type semiconductor layer 7 remains also on the drain electrode side of the convex portion 7a in the third embodiment. In other words, in the third embodiment, both of the source electrode 11s and the drain electrode 11d are formed on the p-type semiconductor layer 7. The convex portion 7a is provided at a position of the p-type semiconductor layer 7 between the source electrode 11s and the drain electrode 11d in planar view, and the thickness of the p-type semiconductor layer 7 at a position of the convex portion 7a is 300 Å (30 nm) or more, for example. A portion of the p-type semiconductor layer 7 on the drain electrode 11d side of the convex portion 7a is thinner than the convex portion 7a, a thickness of the portion is 50 Å (5 nm) or less, for example. The drain electrode 11d has a structure similar to one in the second embodiment. The convex portion 7a is an example of the first p-type semiconductor layer, and the portions of the p-type semiconductor layer 7 below the source electrode 11s and the drain electrode 11d are an example of the second p-type semiconductor layer. The metal films 11sa and 11da are an example of the first metal film, and the metal film 11sb and 11db are an example of the second metal film. Other structure is similar to the first embodiment.

The third embodiment thus configured successfully achieves the effect of further suppressing and relaxing the concentration of the current density, with the presence of both of the metal films 11sb and 11db.

Fourth, Fifth and Sixth Embodiments

Figure 9A:
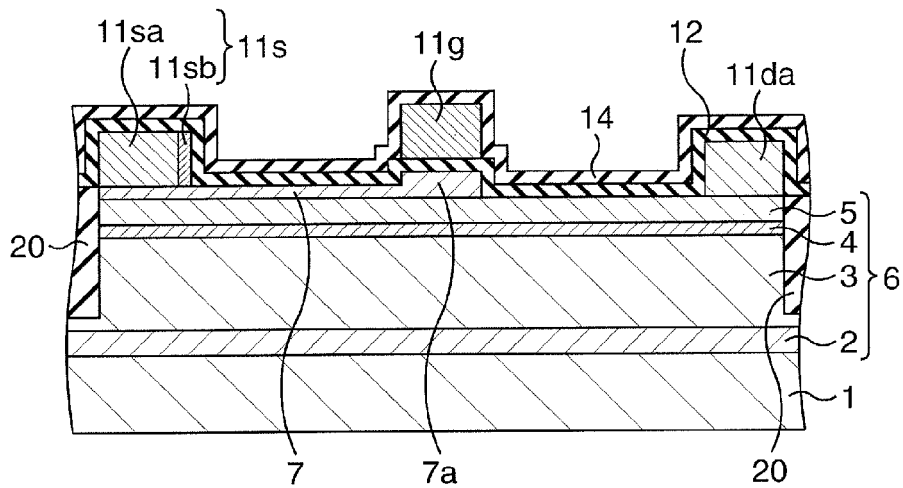
FIG. 9A is a cross sectional view illustrating a structure of a compound semiconductor device according to a fourth embodiment.
Figure 9B:
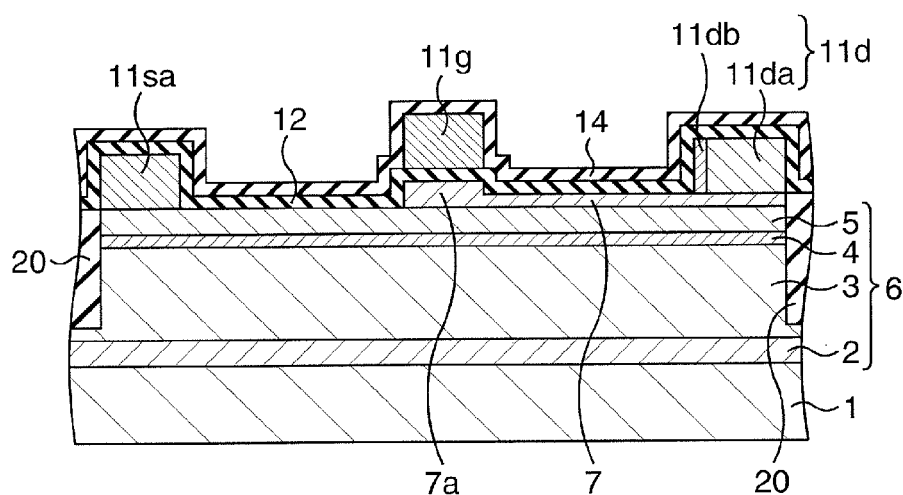
FIG. 9B is a cross sectional view illustrating a structure of a compound semiconductor device according to a fifth embodiment.
Figure 9C:
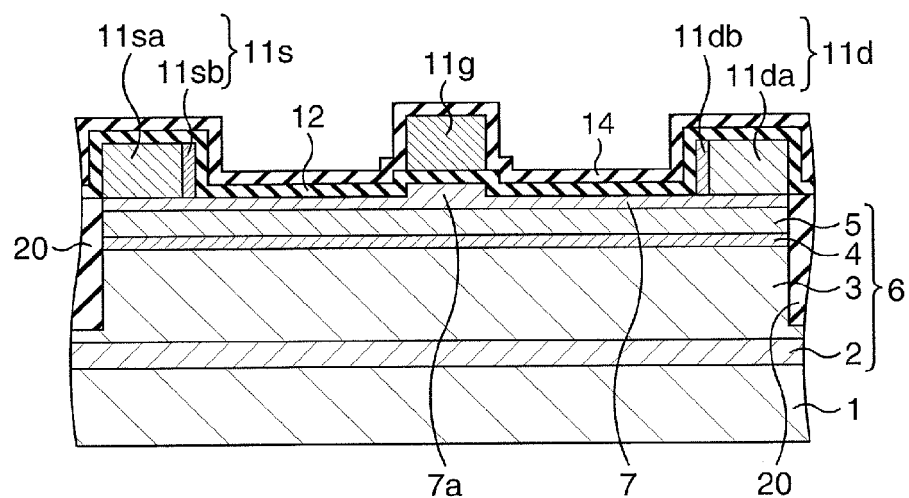
FIG. 9C is a cross sectional view illustrating a structure of a compound semiconductor device according to a sixth embodiment.

Next, a fourth embodiment, a fifth embodiment and a sixth embodiment will be explained. FIGS. 9A to 9C are cross sectional views illustrating structures of GaN-based HEMTs (compound semiconductor devices) according to the fourth embodiment, the fifth embodiment and the sixth embodiment.

In contrast to the first embodiment, the second embodiment and the third embodiment, having the gate electrode 11g brought into Schottky contact with the compound semiconductor stacked structure 6, the fourth embodiment, the fifth embodiment and the sixth embodiment adopt the insulating film 12 between the gate electrode 11g and the compound semiconductor stacked structure 6, so as to allow the insulating film 12 to function as a gate insulating film. In short, the opening 13g is not formed in the insulating film 12, and a MIS-type structure is adopted. FIG. 9A illustrates the fourth embodiment corresponding a modified example of the first embodiment, FIG. 9B illustrates the fifth embodiment corresponding a modified example of the second embodiment, and FIG. 9C illustrates the sixth embodiment corresponding a modified example of the third embodiment.

Also the fourth embodiment, the fifth embodiment and the sixth embodiment thus configured successfully achieve, similarly to the first embodiment, the second embodiment and the third embodiment, respectively, the effect of suppressing and relaxing the concentration of the current density, with the presence of the p-type semiconductor layer 7 and the metal film 11sb and/or 11db.

A Material for the insulating film 12 is not specifically limited, wherein the preferable examples include oxide, nitride or oxynitride of Si, Al, Hf, Zr, Ti, Ta and W. Aluminum oxide is particularly preferable. Thickness of the insulating film 12 may be 2 nm to 200 nm, and 10 nm or around, for example.

Seventh, Eighth and Ninth Embodiments

Figure 10A:
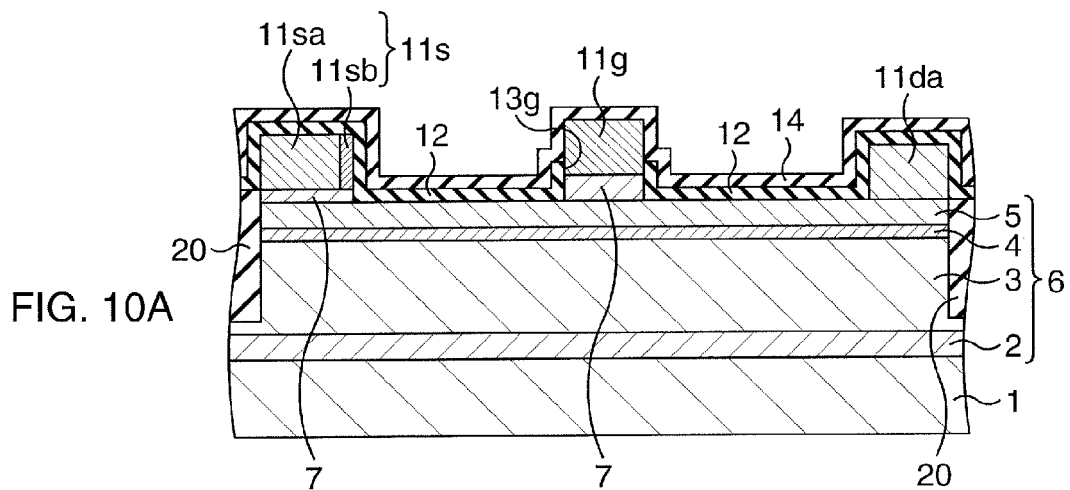
FIG. 10A is a cross sectional view illustrating a structure of a compound semiconductor device according to a seventh embodiment.
Figure 10B:
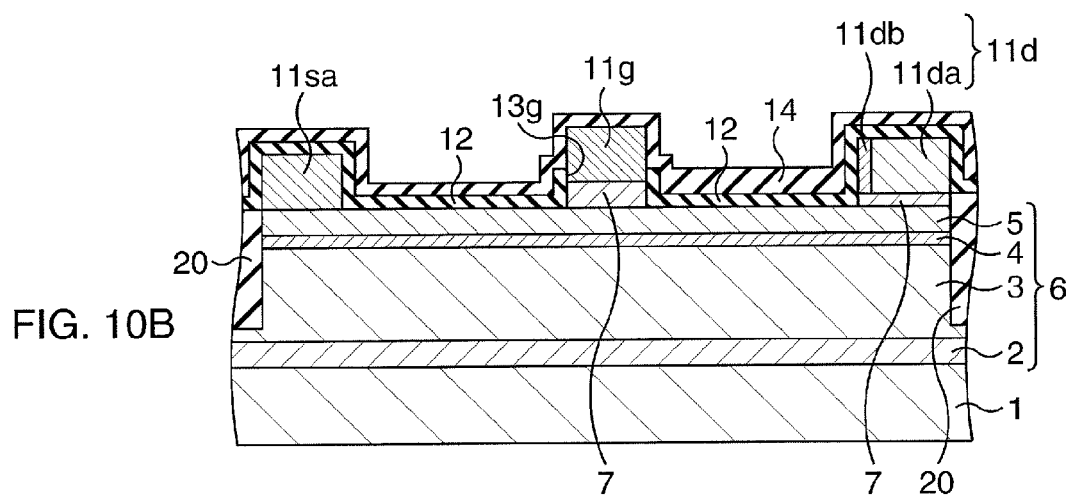
FIG. 10B is a cross sectional view illustrating a structure of a compound semiconductor device according to an eighth embodiment.
Figure 10C:
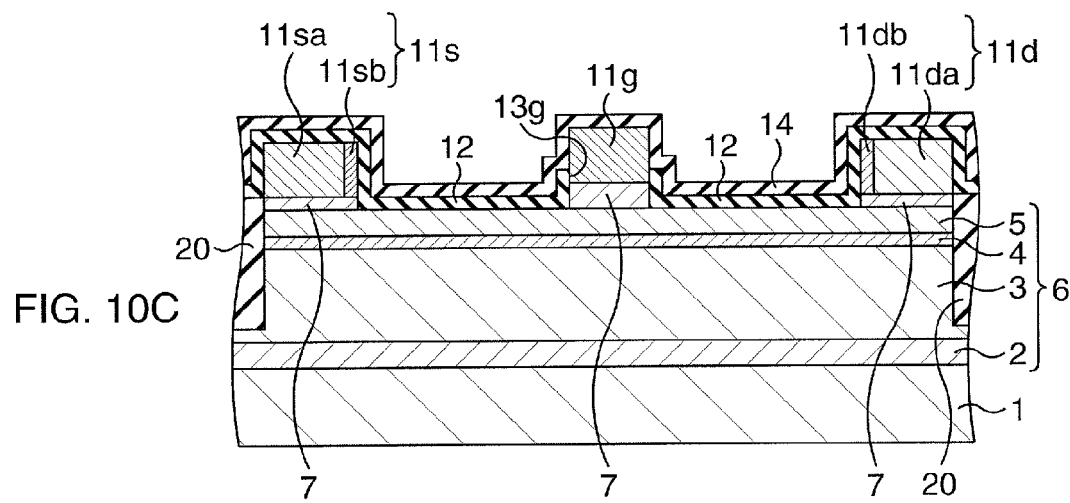
FIG. 10C is a cross sectional view illustrating a structure of a compound semiconductor device according to a ninth embodiment.

Next, a seventh embodiment, an eighth embodiment and a ninth embodiment will be explained. FIGS. 10A to 10C are cross sectional views illustrating structures of GaN-based HEMTs (compound semiconductor devices) according to the seventh embodiment, the eighth embodiment and the ninth embodiment.

In contrast to the first embodiment, the second embodiment and the third embodiment, having the p-type semiconductor layer 7 stretching on the source electrode 11s side and/or the drain electrode 11d side, the p-type semiconductor layer 7 is provided only below the source electrode 11s and/or the drain electrode 11d in the seventh embodiment, the eighth embodiment and the ninth embodiment. In other words, the p-type semiconductor layer 7 is not provided in a region between the gate electrode 11g and the source electrode 11s, and in a region between the gate electrode 11g and the drain electrode 11d. FIG. 10A illustrates the seventh embodiment corresponding a modified example of the first embodiment, FIG. 10B illustrates the eighth embodiment corresponding a modified example of the second embodiment, and FIG. 10C illustrates the ninth embodiment corresponding a modified example of the third embodiment.

Also the seventh embodiment, the eighth embodiment and the ninth embodiment thus configured successfully achieve, similarly to the first embodiment, the second embodiment and the third embodiment, respectively, the effect of suppressing and relaxing the concentration of the current density, with the presence of the p-type semiconductor layer 7 and the metal film 11sb and/or 11db. Moreover, the resistance can be reduced, since the area where the p-type semiconductor layer 7 exists is smaller and the density of 2DEG is higher in the vicinity of the surface of the electron channel layer 3.

Tenth and Eleventh Embodiments

Figure 11A:
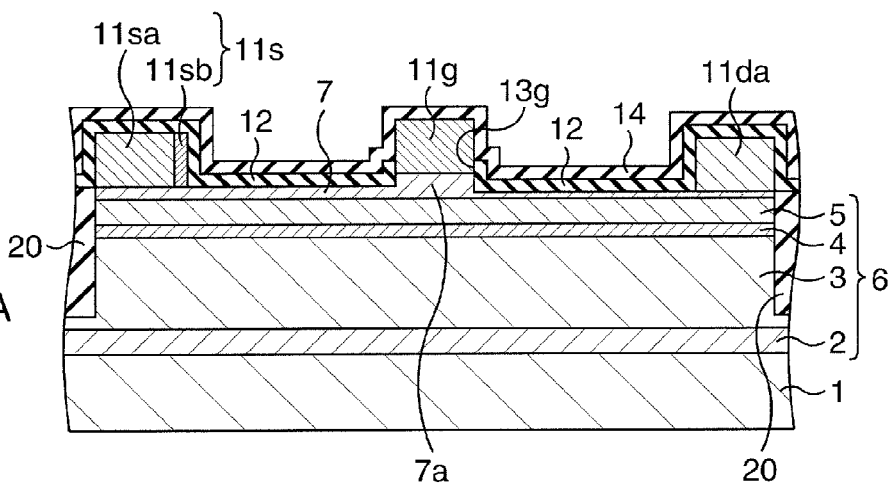
FIG. 11A is a cross sectional view illustrating a structure of a compound semiconductor device according to a tenth embodiment.
Figure 11B:
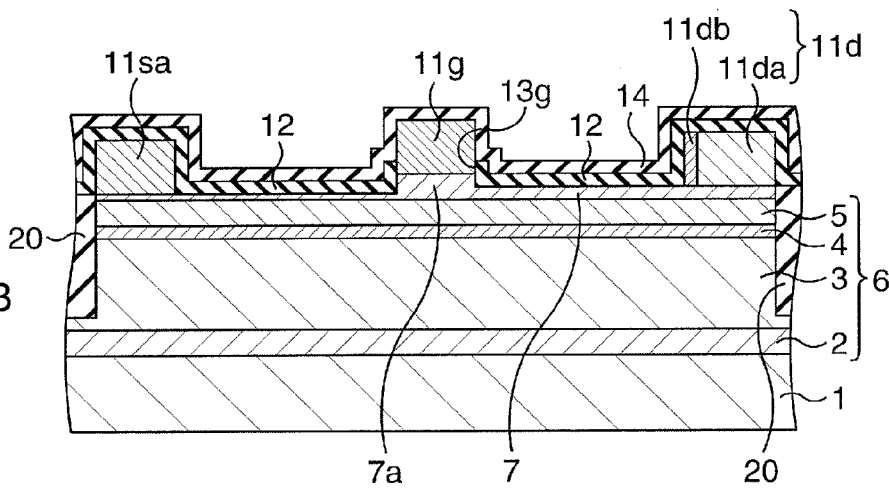
FIG. 11B is a cross sectional view illustrating a structure of a compound semiconductor device according to an eleventh embodiment.

Next, a tenth embodiment and an eleventh embodiment will be explained. FIGS. 11A and 11B are cross sectional views illustrating structures of GaN-based HEMTs (compound semiconductor devices) according to the tenth embodiment and the eleventh embodiment.

In contrast to the first embodiment, having no p-type semiconductor layer 7 on the metal film 11da side of the gate electrode 11g, the p-type semiconductor layer 7 includes a portion on the metal film 11da side thinner than a portion on the metal film 11sa side in the tenth embodiment. In contrast to the second embodiment, having no p-type semiconductor layer 7 on the metal film 11sa side of the gate electrode 11g, the p-type semiconductor layer 7 includes a portion on the metal film 11sa side thinner than a portion on the metal film 11da side in the eleventh embodiment.

FIG. 11A illustrates the tenth embodiment corresponding a modified example of the first embodiment, and FIG. 11B illustrates the eleventh embodiment corresponding a modified example of the second embodiment.

Also the tenth embodiment and the eleventh embodiment thus configured successfully achieve, similarly to the first embodiment and the second embodiment, respectively, the effect of suppressing and relaxing the concentration of the current density, with the presence of the p-type semiconductor layer 7 and the metal film 11sb or 11db. Moreover, the deterioration of characteristic can be suppressed more successively, since the p-type semiconductor layer 7 exists more widely.

Twelfth Embodiment

Figure 12:
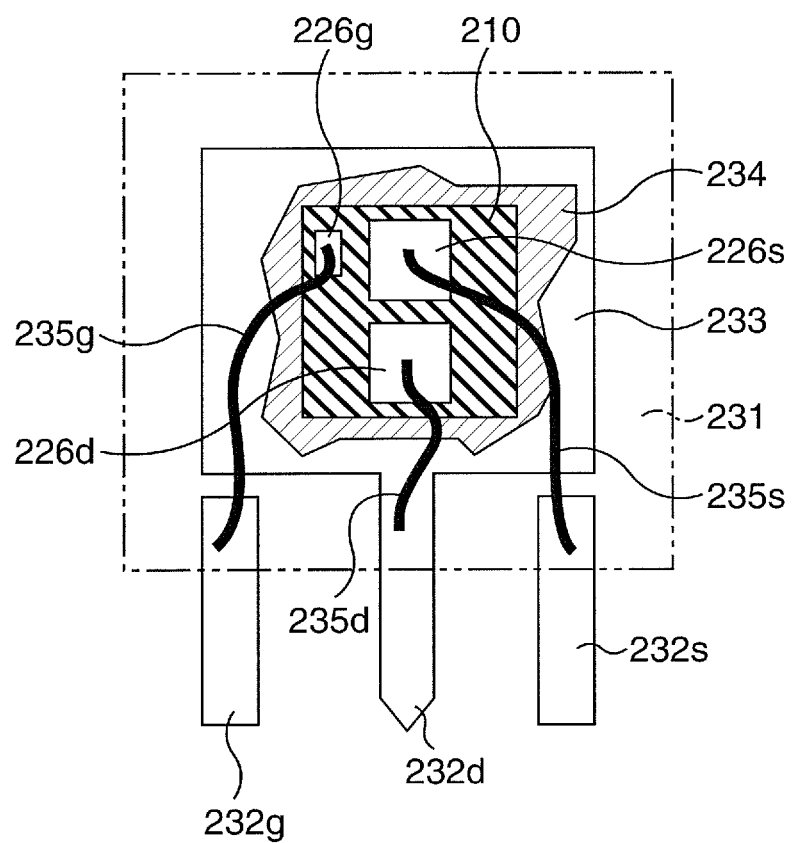
FIG. 12 is a drawing illustrating a discrete package according to a twelfth embodiment.

A twelfth embodiment relates to a discrete package of a compound semiconductor device which includes a GaN-based HEMT. FIG. 12 is a drawing illustrating the discrete package according to the twelfth embodiment.

In the twelfth embodiment, as illustrated in FIG. 12, a back surface of a HEMT chip 210 of the compound semiconductor device according to any one of the first to eleventh embodiments is fixed on a land (die pad) 233, using a die attaching agent 234 such as solder. One end of a wire 235d such as an Al wire is bonded to a drain pad 226d, to which the drain electrode 11d is connected, and the other end of the wire 235d is bonded to a drain lead 232d integral with the land 233. One end of a wire 235s such as an Al wire is bonded to a source pad 226s, to which the source electrode 11s is connected, and the other end of the wire 235s is bonded to a source lead 232s separated from the land 233. One end of a wire 235g such as an Al wire is bonded to a gate pad 226g, to which the gate electrode 11g is connected, and the other end of the wire 235g is bonded to a gate lead 232g separated from the land 233. The land 233, the HEMT chip 210 and so forth are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Next, with the wires 235g, 235d and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. Then molding with the molding resin 231 is conducted by a transfer molding process. The lead frame is then cut away.

Thirteenth Embodiment

Figure 13:
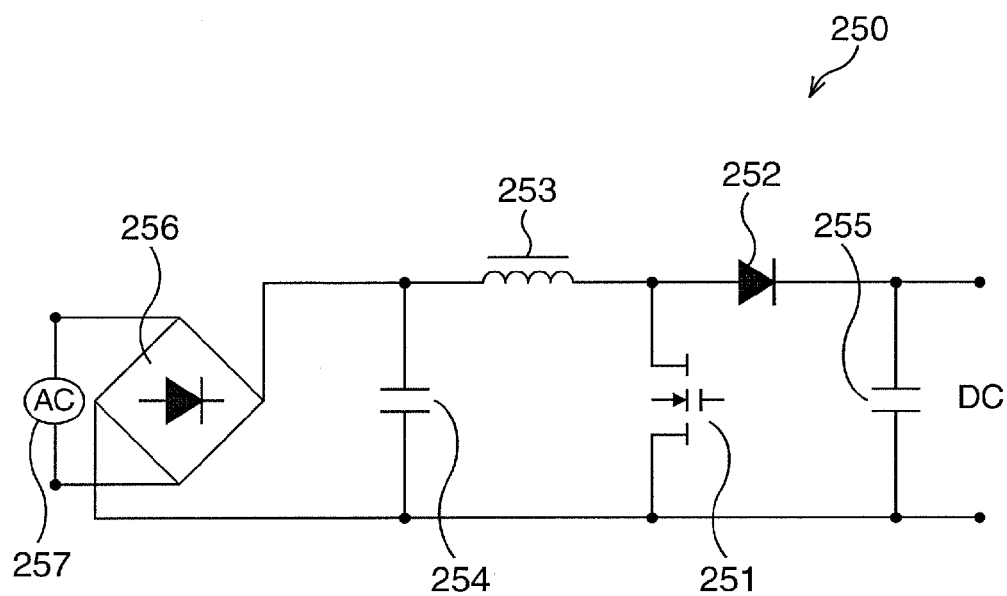
FIG. 13 is a wiring diagram illustrating a power factor correction (PFC) circuit according to a thirteenth embodiment.

Next, a thirteenth embodiment will be explained. The thirteenth embodiment relates to a PFC (power factor correction) circuit equipped with a compound semiconductor device which includes a GaN-based HEMT. FIG. 13 is a wiring diagram illustrating the PFC circuit according to the thirteenth embodiment.

The PFC circuit 250 includes a switching element (transistor) 251, a diode 252, a choke coil 253, capacitors 254 and 255, a diode bridge 256, and an AC power source (AC) 257. The drain electrode of the switching element 251, the anode terminal of the diode 252, and one terminal of the choke coil 253 are connected with each other. The source electrode of the switching element 251, one terminal of the capacitor 254, and one terminal of the capacitor 255 are connected with each other. The other terminal of the capacitor 254 and the other terminal of the choke coil 253 are connected with each other. The other terminal of the capacitor 255 and the cathode terminal of the diode 252 are connected with each other. A gate driver is connected to the gate electrode of the switching element 251. The AC 257 is connected between both terminals of the capacitor 254 via the diode bridge 256. A DC power source (DC) is connected between both terminals of the capacitor 255. In the embodiment, the compound semiconductor device according to any one of the first to thirteenth embodiments is used as the switching element 251.

In the process of manufacturing the PFC circuit 250, for example, the switching element 251 is connected to the diode 252, the choke coil 253 and so forth with solder, for example.

Fourteenth Embodiment

Figure 14:
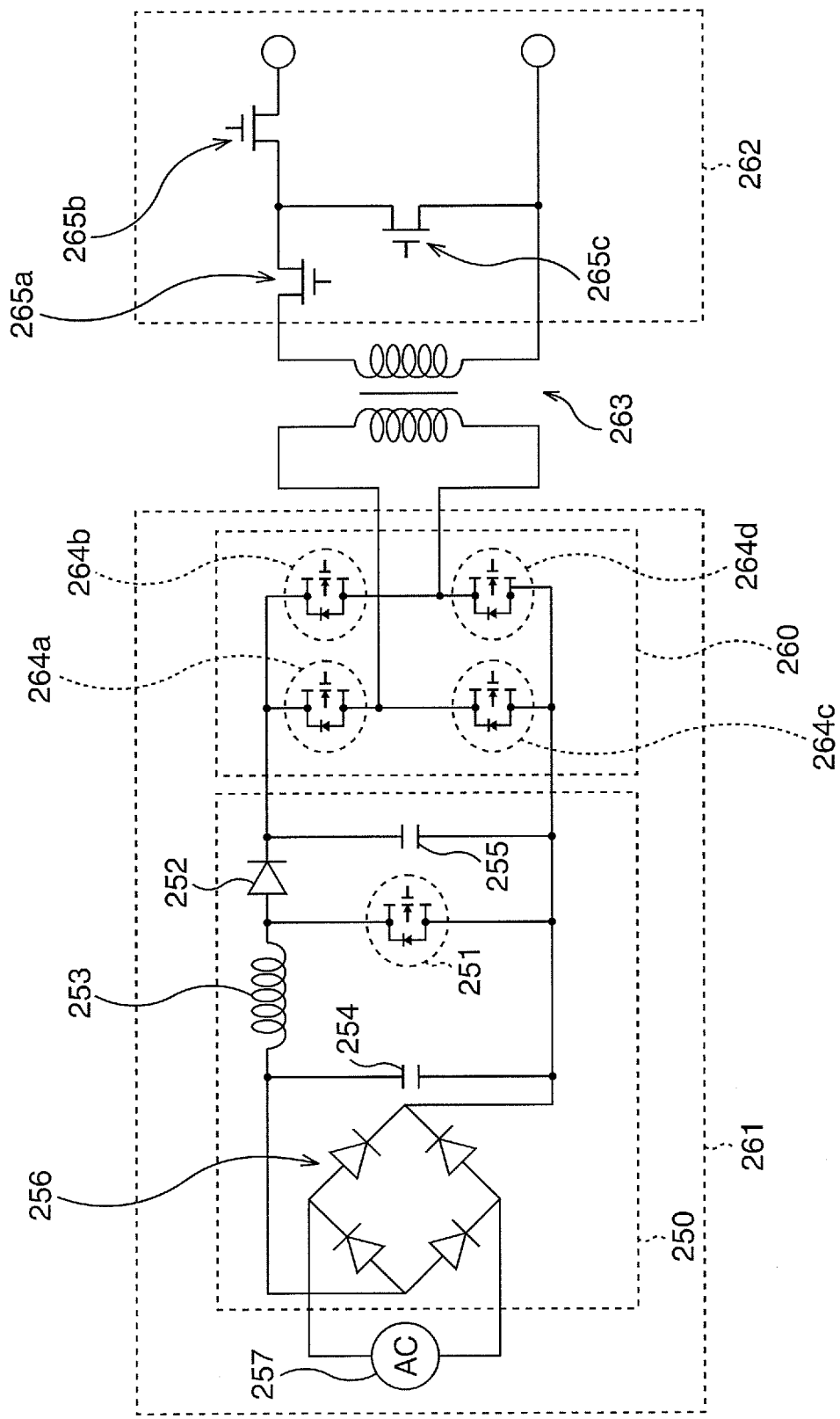
FIG. 14 is a wiring diagram illustrating a power supply apparatus according to a fourteenth embodiment.

Next, a fourteenth embodiment will be explained. The fourteenth embodiment relates to a power supply apparatus equipped with a compound semiconductor device which includes a GaN-based HEMT. FIG. 14 is a wiring diagram illustrating the power supply apparatus according to the fourteenth embodiment.

The power supply apparatus includes a high-voltage, primary-side circuit 261, a low-voltage, secondary-side circuit 262, and a transformer 263 arranged between the primary-side circuit 261 and the secondary-side circuit 262.

The primary-side circuit 261 includes the PFC circuit 250 according to the thirteenth embodiment, and an inverter circuit, which may be a full-bridge inverter circuit 260, for example, connected between both terminals of the capacitor 255 in the PFC circuit 250. The full-bridge inverter circuit 260 includes a plurality of (four, in the embodiment) switching elements 264a, 264b, 264c and 264d.

The secondary-side circuit 262 includes a plurality of (three, in the embodiment) switching elements 265a, 265b and 265c.

In the embodiment, the compound semiconductor device according to any one of first to eleventh embodiments is used for the switching element 251 of the PFC circuit 250, and for the switching elements 264a, 264b, 264c and 264d of the full-bridge inverter circuit 260. The PFC circuit 250 and the full-bridge inverter circuit 260 are components of the primary-side circuit 261. On the other hand, a silicon-based general MIS-FET (field effect transistor) is used for the switching elements 265a, 265b and 265c of the secondary-side circuit 262.

Fifteenth Embodiment

Figure 15:
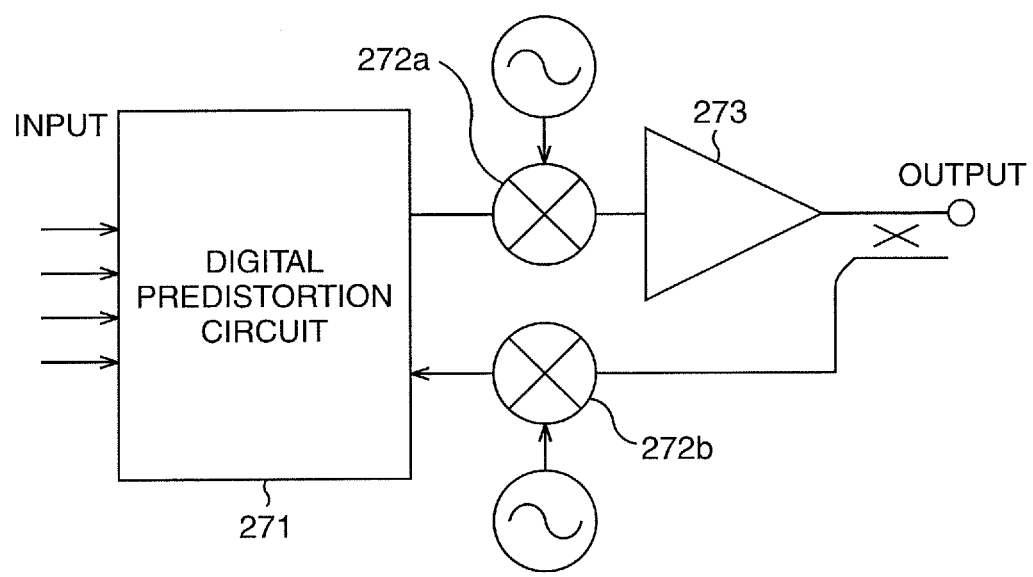
FIG. 15 is a wiring diagram illustrating a high-frequency amplifier according to a fifteenth embodiment.

Next, a fifteenth embodiment will be explained. The fifteenth embodiment relates to a high-frequency amplifier equipped with a compound semiconductor device which includes a GaN-based HEMT. FIG. 15 is a wiring diagram illustrating the high-frequency amplifier according to the fifteenth embodiment.

The high-frequency amplifier includes a digital predistortion circuit 271, mixers 272a and 272b, and a power amplifier 273.

The digital predistortion circuit 271 compensates non-linear distortion in input signals. The mixer 272a mixes the input signal having the non-linear distortion already compensated, with an AC signal. The power amplifier 273 includes the compound semiconductor device according to any one of the first to eleventh embodiments, and amplifies the input signal mixed with the AC signal. In the illustrated example of the embodiment, the signal on the output side may be mixed, upon switching, with an AC signal by the mixer 272b, and may be sent back to the digital predistortion circuit 271.

Composition of the compound semiconductor layers used for the compound semiconductor stacked structure is not specifically limited, and GaN, AlN, InN and so forth may be used. Also mixed crystals of them may be used.

In the embodiments, the substrate may be a silicon carbide (SiC) substrate, a sapphire substrate, a silicon substrate, a GaN substrate, a GaAs substrate or the like. The substrate may be any of electro-conductive, semi-insulating, and insulating ones.

Configurations of the gate electrode, the source electrode and the drain electrode are not limited to those in the above-described embodiments. For example, they may be configured by a single layer. The method of forming these electrodes is not limited to the lift-off process. The annealing after the formation of the source electrode and the drain electrode may be omissible, so long as the ohmic characteristic is obtainable. The gate electrode may be annealed. The first metal film may contain one selected from the group consisting of Ir, W, Cu, Ag, Zn, Cr, Al, Ti, Mn, Ta, Si, TaN, TiN, $Si_3N_4$, Ru, ITO (indium tin oxide), NiO, IrO, SrRuO, $CoSi_2$, $WSi_2$, NiSi, $MoSi_2$, $TiSi_2$, Al—Si, Al—Cu, and Al—Si—Cu, for example. The second metal film may contain one selected from the group consisting of Ni, Pd, Au, and Pt, for example.

According to the compound semiconductor devices and so forth described above, stable operation can be achievable for long periods, with the presence of the second p-type semiconductor layer and the source electrode and/or the drain electrode on the second p-type semiconductor layer.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A compound semiconductor device comprising:
a substrate;
an electron channel layer and an electron supply layer formed over the substrate;
a gate electrode, a source electrode and a drain electrode formed on or above the electron supply layer;
a first p-type semiconductor layer formed between the electron supply layer and the gate electrode; and
a second p-type semiconductor layer formed between the electron supply layer and at least one of the source electrode and the drain electrode,
wherein the one of the source electrode and the drain electrode on the second p-type semiconductor layer comprises:
a first metal film; and
a second metal film which contacts the first metal film on the gate electrode side of the first metal film, and a resistance of which is higher than that of the first metal film.

2. The compound semiconductor device according to claim 1, wherein a thickness of the second p-type semiconductor layer is 5 nm or smaller.

3. The compound semiconductor device according to claim 1, wherein the first p-type semiconductor layer and the second p-type semiconductor layer are integral with each other.

4. The compound semiconductor device according to claim 1, wherein the first p-type semiconductor layer is thicker than the second p-type semiconductor layer.

5. The compound semiconductor device according to claim 1, wherein each of the first p-type semiconductor layer and the second p-type semiconductor layer is a p-type GaN layer.

6. The compound semiconductor device according to claim 1, wherein a value of "Sb/Sa" is 0.0065 or more and 0.02 or less, "Sa" representing a contact area between the first metal film and the second p-type semiconductor layer and "Sa" representing a contact area between the second metal film and the second p-type semiconductor layer.

7. The compound semiconductor device according to claim 1, wherein the first metal film contains one selected from the group consisting of Ir, W, Cu, Ag, Zn, Cr, Al, Ti, Mn, Ta, Si, TaN, TiN, $Si_3N_4$, Ru, ITO (indium tin oxide), NiO, IrO, SrRuO, $CoSi_2$, $WSi_2$, NiSi, $MoSi_2$, $TiSi_2$, Al—Si, Al—Cu, and Al—Si—Cu.

8. The compound semiconductor device according to claim 1, wherein the second metal film contains one selected from the group consisting of Ni, Pd, Au, and Pt.

9. A power supply apparatus comprising
a compound semiconductor device, which comprises:
a substrate;
an electron channel layer and an electron supply layer formed over the substrate;
a gate electrode, a source electrode and a drain electrode formed on or above the electron supply layer;
a first p-type semiconductor layer formed between the electron supply layer and the gate electrode; and
a second p-type semiconductor layer formed between the electron supply layer and at least one of the source electrode and the drain electrode,
wherein the one of the source electrode and the drain electrode on the second p-type semiconductor layer comprises:
a first metal film; and
a second metal film which contacts the first metal film on the gate electrode side of the first metal film, and a resistance of which is higher than that of the first metal film.

10. An amplifier comprising
a compound semiconductor device, which comprises:
a substrate;
an electron channel layer and an electron supply layer formed over the substrate;
a gate electrode, a source electrode and a drain electrode formed on or above the electron supply layer;
a first p-type semiconductor layer formed between the electron supply layer and the gate electrode; and
a second p-type semiconductor layer formed between the electron supply and at least one of the source electrode and the drain electrode,
wherein the one of the source electrode and the drain electrode on the second p-type semiconductor layer comprises:
a first metal film; and
a second metal film which contacts the first metal film on the gate electrode side of the first metal film, and a resistance of which is higher than that of the first metal film.

11. A method of manufacturing a compound semiconductor device, comprising:
forming an electron channel layer and an electron supply layer over the substrate;
forming a first p-type semiconductor layer and a second p-type semiconductor layer on or above the electron supply layer;
forming a gate electrode, a source electrode and a drain electrode on or above the electron supply layer, wherein the gate electrode is formed above the first p-type semiconductor layer,
at least one of the source electrode and the drain electrode is formed on the second p-type semiconductor layer, and
the forming the gate electrode, the source electrode and the drain electrode comprises:
forming a first metal film; and
forming a second metal film which contacts the first metal film on the gate electrode side of the first metal film, and a resistance of which is higher than that of the first metal film, the first metal film and the second film being in the one of the source electrode and the drain electrode on the second p-type semiconductor layer.

12. The method of manufacturing a compound semiconductor device according to claim 11, wherein a thickness of the second p-type semiconductor layer is 5 nm or smaller.

13. The method of manufacturing a compound semiconductor device according to claim 11, wherein the first p-type semiconductor layer and the second p-type semiconductor layer are integral with each other.

14. The method of manufacturing a compound semiconductor device according to claim 11, wherein the first p-type semiconductor layer is thicker than the second p-type semiconductor layer.

15. The method of manufacturing a compound semiconductor device according to claim 11, wherein each of the first p-type semiconductor layer and the second p-type semiconductor layer is a p-type GaN layer.

16. The method of manufacturing a compound semiconductor device according to claim 11, wherein a value of "Sb/Sa" is 0.0065 or more and 0.02 or less, "Sa" representing a contact area between the first metal film and the second p-type semiconductor layer and "Sa" representing a contact area between the second metal film and the second p-type semiconductor layer.

17. The method of manufacturing a compound semiconductor device according to claim 11, wherein the first metal film contains one selected from the group consisting of Ir, W, Cu, Ag, Zn, Cr, Al, Ti, Mn, Ta, Si, TaN, TiN, $Si_3N_4$, RU, ITO (indium tin oxide), NiO, IrO, SrRuO, $CoSi_2$, $WSi_2$, NiSi, $MoSi_2$, $TiSi_2$, Al—Si, Al—Cu, and Al—Si—Cu.

18. The method of manufacturing a compound semiconductor device according to claim 11, wherein the second metal film contains one selected from the group consisting of Ni, Pd, Au, and Pt.

* * * * *